United States Patent
Tian et al.

(10) Patent No.: US 11,675,237 B2
(45) Date of Patent: Jun. 13, 2023

(54) ARRAY SUBSTRATE AND METHOD FOR MANUFACTURING THE SAME, DISPLAY PANEL AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Maokun Tian, Beijing (CN); Zhonghao Huang, Beijing (CN); Xu Wu, Beijing (CN); Chengjun Qi, Beijing (CN); Jun Wang, Beijing (CN); Dan Liu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/241,140

(22) Filed: Apr. 27, 2021

(65) Prior Publication Data
US 2022/0057679 A1 Feb. 24, 2022

(30) Foreign Application Priority Data
Aug. 21, 2020 (CN) .......................... 202010851702.6

(51) Int. Cl.
*G02F 1/1362* (2006.01)
*H01L 27/12* (2006.01)

(52) U.S. Cl.
CPC ...... *G02F 1/136209* (2013.01); *H01L 27/127* (2013.01); *H01L 27/1237* (2013.01)

(58) Field of Classification Search
CPC ............... H01L 27/127; H01L 27/1237; H01L 27/1214; H01L 27/1225; H01L 27/1248;
(Continued)

(56) References Cited

U.S. PATENT DOCUMENTS

| | | | | |
|---|---|---|---|---|
| 2004/0257489 A1* | 12/2004 | Gotoh | ............... | G02F 1/136209 257/E27.113 |
| 2005/0052604 A1* | 3/2005 | Kim | .................. | G02F 1/134363 349/141 |
| 2011/0241005 A1* | 10/2011 | Ro | ...................... | H01L 27/1281 438/34 |
| 2014/0042429 A1 | 2/2014 | Park et al. | | |
| 2014/0061632 A1* | 3/2014 | Lee | .................. | H01L 29/78636 257/43 |

(Continued)

FOREIGN PATENT DOCUMENTS

| | | | | |
|---|---|---|---|---|
| CN | 106129066 | | 11/2016 | |
| CN | 107068770 A | * | 8/2017 | ....... H01L 29/41733 |

(Continued)

OTHER PUBLICATIONS

Chinese First Office Action (w/ English translation) for corresponding Chinese Application No. 202010851702,6, dated Jun. 28, 2022, 15 pages.

*Primary Examiner* — Hoan C Nguyen
(74) *Attorney, Agent, or Firm* — Dority & Manning, P.A.

(57) ABSTRACT

An array substrate includes a base substrate, a light-shielding pattern, a buffer pattern, an active layer, a gate insulating layer and a first passivation layer provided with a first via, a second via and a third via, and a source and a drain. An entire orthographic projection of the active layer on the base substrate coincides with an orthographic projection of at least part of the buffer pattern on the base substrate. The orthographic projection of the buffer pattern on the base substrate is within a border of an orthographic projection of (Continued)

the light-shielding pattern on the base substrate, and its area is less than an area of the orthographic projection of the light-shielding pattern on the base substrate. One of the source and the drain is coupled to the active layer through the first via, and another one is coupled to the active layer through the second via and the light-shielding pattern through the third via.

17 Claims, 17 Drawing Sheets

(58) Field of Classification Search
CPC ........... H01L 29/78633; H01L 27/3244; H01L 27/3272; H01L 27/3248; H01L 29/7869; H01L 27/1218; H01L 29/78648; H01L 27/3262; H01L 27/3241; H01L 27/3274; G02F 1/136209; G02F 1/134363; G02F 1/1362; G02F 1/136227
See application file for complete search history.

(56) References Cited

U.S. PATENT DOCUMENTS

| | | | |
|---|---|---|---|
| 2015/0162420 A1* | 6/2015 | Park | H01L 29/786 438/151 |
| 2015/0214120 A1 | 7/2015 | Yang et al. | |
| 2017/0317104 A1* | 11/2017 | Jeong | H01L 27/124 |
| 2020/0066758 A1 | 2/2020 | Yang et al. | |
| 2021/0226067 A1 | 7/2021 | Wang et al. | |
| 2021/0327964 A1 | 10/2021 | Jeon et al. | |

FOREIGN PATENT DOCUMENTS

| | | | | |
|---|---|---|---|---|
| CN | 109378298 A | * | 2/2019 | ......... H01L 27/1222 |
| CN | 110797355 | | 2/2020 | |
| CN | 111403488 | | 7/2020 | |
| CN | 109860305 B | * | 11/2020 | ....... H01L 29/66969 |
| KR | 20110075411 A | * | 7/2011 | |
| KR | 20160036418 | * | 4/2016 | |
| WO | WO-2020075923 A1 | * | 4/2020 | ......... H01L 27/3213 |

* cited by examiner ance ARRAY SUBSTRATE AND METHOD FOR MANUFACTURING THE SAME, DISPLAY PANEL AND DISPLAY DEVICE

CROSS-REFERENCE TO RELATED APPLICATION

This application claims priority to Chinese Patent Application No. 202010851702.6, filed on Aug. 21, 2020, which is incorporated herein by reference in its entirety.

TECHNICAL FIELD

The present disclosure relates to the field of display technologies, and in particular, to an array substrate and a method for manufacturing the same, a display panel, and a display device.

BACKGROUND

With the development of liquid crystal display technology, thin film transistors (abbreviated as TFTs) such as metal oxide thin film transistors and indium gallium zinc oxide (abbreviated as IGZO) thin film transistors have high carrier mobility, and gradually attract people's attention.

SUMMARY

In one aspect, an array substrate is provided. The array substrate includes a base substrate, and a light-shielding pattern, a buffer pattern, an active layer, a gate insulating layer and a first passivation layer that are sequentially arranged on the base substrate, and a source and a drain disposed on a side of the first passivation layer away from the base substrate. An entire orthographic projection of the active layer on the base substrate coincides with an orthographic projection of at least part of the buffer pattern on the base substrate. The orthographic projection of the buffer pattern on the base substrate is within a border of an orthographic projection of the light-shielding pattern on the base substrate. An area of the orthographic projection of the buffer pattern on the base substrate is less than an area of the orthographic projection of the light-shielding pattern on the base substrate. The gate insulating layer and the first passivation layer are provided with a first via, a second via and a third via that penetrate the gate insulating layer and the first passivation layer. The first via and the second via are used for exposing portions of the active layer, respectively, and the third via is used for exposing a portion of the light-shielding pattern. One of the source and the drain is coupled to the active layer through the first via. Another of the source and the drain is coupled to the active layer through the second via, and is coupled to the light-shielding pattern through the third via.

In some embodiments, a depth of the second via is substantially equal to a depth of the third via.

In some embodiments, a border of the orthographic projection of the buffer pattern on the base substrate substantially coincides with a border of the orthographic projection of the active layer on the base substrate.

In some embodiments, a border of the orthographic projection of the buffer pattern on the base substrate and the border of the orthographic projection of the light-shielding pattern on the base substrate have a distance therebetween.

In some embodiments, the orthographic projection of the buffer pattern on the base substrate and the orthographic projection of the light-shielding pattern on the base substrate are both in a shape of a rectangle, and a minimum distance between each edge of the border of the orthographic projection of the buffer pattern on the base substrate and a respective edge of the border of the orthographic projection of the light-shielding pattern on the base substrate is substantially equal.

In some embodiments, a ratio of the area of the orthographic projection of the buffer pattern on the base substrate to the area of the orthographic projection of the light-shielding pattern on the base substrate is in a range from 25% to 40%.

In some embodiments, the array substrate further includes a second passivation layer, a planarization layer, a first electrode layer, a third passivation layer and a second electrode layer that are sequentially arranged on a side of the first passivation layer away from the base substrate. The second passivation layer, the planarization layer, the first electrode layer, and the third passivation layer are provided with a fourth via. The fourth via is used for exposing at least a part of the source or at least a part of the drain. The second electrode layer is coupled to the source or the drain through the fourth via.

In some embodiments, the second passivation layer and the third passivation layer are made of a same material.

In some embodiments, the first passivation layer and the gate insulating layer are made of a same material.

In another aspect, a display panel is provided, including the array substrate as described in any of the above embodiments.

In yet another aspect, a display device is provided, including the display panel as described in the above embodiment.

In yet another aspect, a method for manufacturing an array substrate is provided. The method includes: forming a light-shielding pattern, a buffer pattern and an active layer on a base substrate; sequentially forming a gate insulating layer and a first passivation layer on a side of the active layer away from the base substrate; forming a first via, a second via and a third via in the gate insulating layer and the first passivation layer using a first patterning process; and forming a source and a drain on a side of the first passivation layer away from the base substrate. An entire orthographic projection of the active layer on the base substrate coincides with an orthographic projection of at least part of the buffer pattern on the base substrate. The orthographic projection of the buffer pattern on the base substrate is within a border of an orthographic projection of the light-shielding pattern on the base substrate, and an area of the orthographic projection of the buffer pattern on the base substrate is less than an area of the orthographic projection of the light-shielding pattern on the base substrate. The first via, the second via and the third via penetrate the gate insulating layer and the first passivation layer. The first via and the second via are used for exposing portions of the active layer, respectively, and the third via is used for exposing a portion of the light-shielding pattern. One of the source and the drain is coupled to the active layer through the first via. Another of the source and the drain is coupled to the active layer through the second via, and is coupled to the light-shielding pattern through the third via.

In some embodiments, forming the light-shielding pattern, the buffer pattern and the active layer on the base substrate includes: sequentially forming a light-shielding film, a buffer film and an active film on the base substrate; patterning the active film, the buffer film and the light-shielding film using a second patterning process to form an initial active layer, an initial buffer pattern, and an initial light-shielding pattern; removing a peripheral portion of the initial active layer to form the active layer; removing a peripheral portion of the initial buffer pattern to form the buffer pattern; and using the initial light-shielding pattern as a light-shielding pattern; or, removing a peripheral portion of the initial light-shielding pattern to form the light-shielding pattern.

In some embodiments, patterning the active film, the buffer film and the light-shielding film using a second patterning process includes forming a photoresist film on a side of the active film away from the base substrate. After the initial active layer is formed, a photoresist layer covers a surface of the initial active layer away from the base substrate and exposes a side face of the initial active layer. Removing the peripheral portion of the initial active layer to form the active layer includes with the photoresist layer as a protective layer, using a wet etching process to perform etching from a side face of the initial active layer to remove the peripheral portion of the initial active layer to form the active layer. An etching solution used in the wet etching process is incapable of dissolving the initial buffer pattern and the initial light-shielding pattern.

In some embodiments, removing the peripheral portion of the initial buffer pattern to form the buffer pattern includes with the photoresist layer as a protective layer, using a dry etching process to remove a peripheral portion of the initial buffer pattern exposed by the photoresist layer to form the buffer pattern. Etching gas used in the dry etching process is incapable of etching the active layer and the initial light-shielding pattern.

In some embodiments, forming the light-shielding pattern, the buffer pattern and the active layer on the base substrate includes: forming a light-shielding film on the base substrate; patterning the light-shielding film to form the light-shielding pattern; sequentially forming a buffer film and an active film on a side of the light-shielding pattern away from the base substrate; patterning the active film and the buffer film using a third patterning process to form an initial active layer and an initial buffer pattern; removing a peripheral portion of the initial active layer to form the active layer; removing a peripheral portion of the initial buffer pattern to form the buffer pattern.

In some embodiments, patterning the active film and the buffer film using a third patterning process includes forming a photoresist film on a side of the active film away from the base substrate. After the initial active layer is formed, a photoresist layer covers a surface of the initial active layer away from the base substrate and exposes a side face of the initial active layer. Removing the peripheral portion of the initial active layer to form the active layer includes with the photoresist layer as a protective layer, using a wet etching process to perform etching from a side face of the initial active layer to remove the peripheral portion of the initial active layer to form the active layer. An etching solution used in the wet etching process is incapable of dissolving the initial buffer pattern.

In some embodiments, removing the peripheral portion of the initial buffer pattern to form the buffer pattern includes with the photoresist layer as a protective layer, using a dry etching process to remove a peripheral portion of the initial buffer pattern exposed by the photoresist layer to form the buffer pattern. Etching gas used in the dry etching process is incapable of etching the active layer.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products involved in the embodiments of the present disclosure.

DETAILED DESCRIPTION

Figure 1:
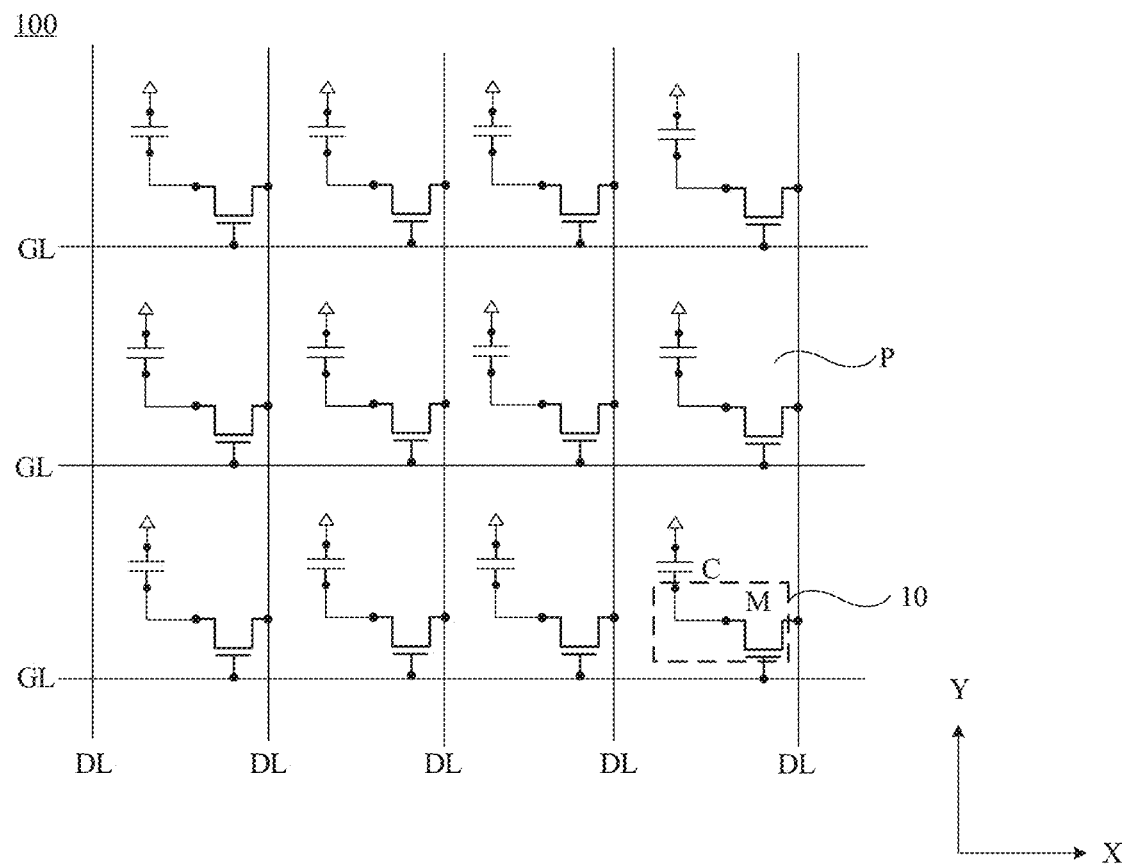
FIG. 1 is a schematic diagram of an array substrate, in accordance with some embodiments.

For convenience of understanding, technical solutions in some embodiments of the present disclosure will be described completely below with reference to the drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed as an open and inclusive meaning, i.e., "include, but not limited to". In the description of the specification, the terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any or more embodiments or examples in any suitable manner.

Hereinafter, the terms such as "first" and "second" are only used for descriptive purposes, and are not to be construed as indicating or implying a relative importance or implicitly indicating the number of indicated technical features below. Thus, features defined by "first" and "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" may also mean that two or more components are not in direct contact with each other, but still cooperate or interact with each other. The embodiments disclosed herein are not necessarily limited to the content herein.

The term "and/or" includes the following three combinations: only A, only B, and a combination of A and B.

The use of "configured to" indicates an open and inclusive meaning, which does not exclude apparatuses that are applicable to or configured to perform additional tasks or steps.

The term "approximately" or "substantially" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

At present, a plurality of films included in a metal oxide thin film transistor are formed using patterning processes. Since steps of a patterning process are complicated, and the cost is high, how to reduce the number of the patterning processes to reduce the cost and increase the productivity of metal oxide thin film transistor is one of the main research issues.

Some embodiments of the present disclosure provide an array substrate. As shown in FIG. 1, the array substrate 100 includes a plurality of sub-pixels P. At least one sub-pixel P, e.g., each sub-pixel P, includes a pixel driving circuit 10. The pixel driving circuit 10 includes at least one thin film transistor M. FIG. 1 only shows an example in which a sub-pixel P includes one thin film transistor M, but the sub-pixel P may also include two or more thin film transistors M.

As shown in FIG. 1, the array substrate 100 may further include a plurality of gate lines GL.

In some examples, the gate lines GL extend in a same direction as a row direction in which the pixel driving circuits 10 are arranged. For example, referring to FIG. 1, the gate lines GL extend in an X direction.

The gate lines GL and gates of the thin film transistors M may be located in a same layer and made of a same material. For example, the gate lines GL may be patterned from a same film as the gates of the thin film transistors M. A gate of a thin film transistor M is coupled to a gate line GL, and the gate line GL is used for transmitting a gate scanning signal to the gate to control the thin film transistor M to be turned on or off.

As shown in FIG. 1, the array substrate 100 may further include a plurality of data lines DL.

In some examples, the data lines DL extend in a same direction as a column direction in which the pixel driving circuits 10 are arranged. For example, referring to FIG. 1, the data lines DL extend in a Y direction.

The data lines DL and sources and drains of the thin film transistors M may be located in a same layer and made of a same material. For example, the date lines DL may be patterned from a same film as the sources and the drains of the thin film transistors M. A source or a drain of a thin film transistor M is coupled to a data line DL. The data line DL is used for transmitting a data signal to the thin film transistor M to control a sub-pixel P in which the thin film transistor M is included to display a corresponding gray scale.

In some embodiments, the array substrate is an array substrate of a liquid crystal display device. In this case, referring to FIG. 1, the sub-pixel P further includes a liquid crystal capacitor C, and the liquid crystal capacitor C is coupled to one, which is not coupled to a data line DL, of a source and a drain of a thin film transistor M. For example, the source of the thin film transistor M is coupled to the data line DL, and the drain of the thin film transistor M is coupled to the liquid crystal capacitor C. For another example, the drain of the thin film transistor M is coupled to the data line DL, and the source of the thin film transistor M is coupled to the liquid crystal capacitor C. When the thin film transistor M is turned on, the thin film transistor M may transmit the data signal on the data line DL to the liquid crystal capacitor C.

In some examples, the liquid crystal capacitor C includes two electrodes. One electrode of the liquid crystal capacitor C is coupled to the thin film transistor M, and this electrode may be a pixel electrode of the array substrate. When the data signal is transmitted to the liquid crystal capacitor C, this electrode of the liquid crystal capacitor C may receive the data signal. That is, this electrode has a voltage of the data signal. Another electrode of the liquid crystal capacitor C may be grounded or coupled to a common electrode of the array substrate, or may be a part of the common electrode. In this way, the two electrodes of the liquid crystal capacitor C have a voltage difference therebetween to maintain the display of an image frame.

Figure 3A:
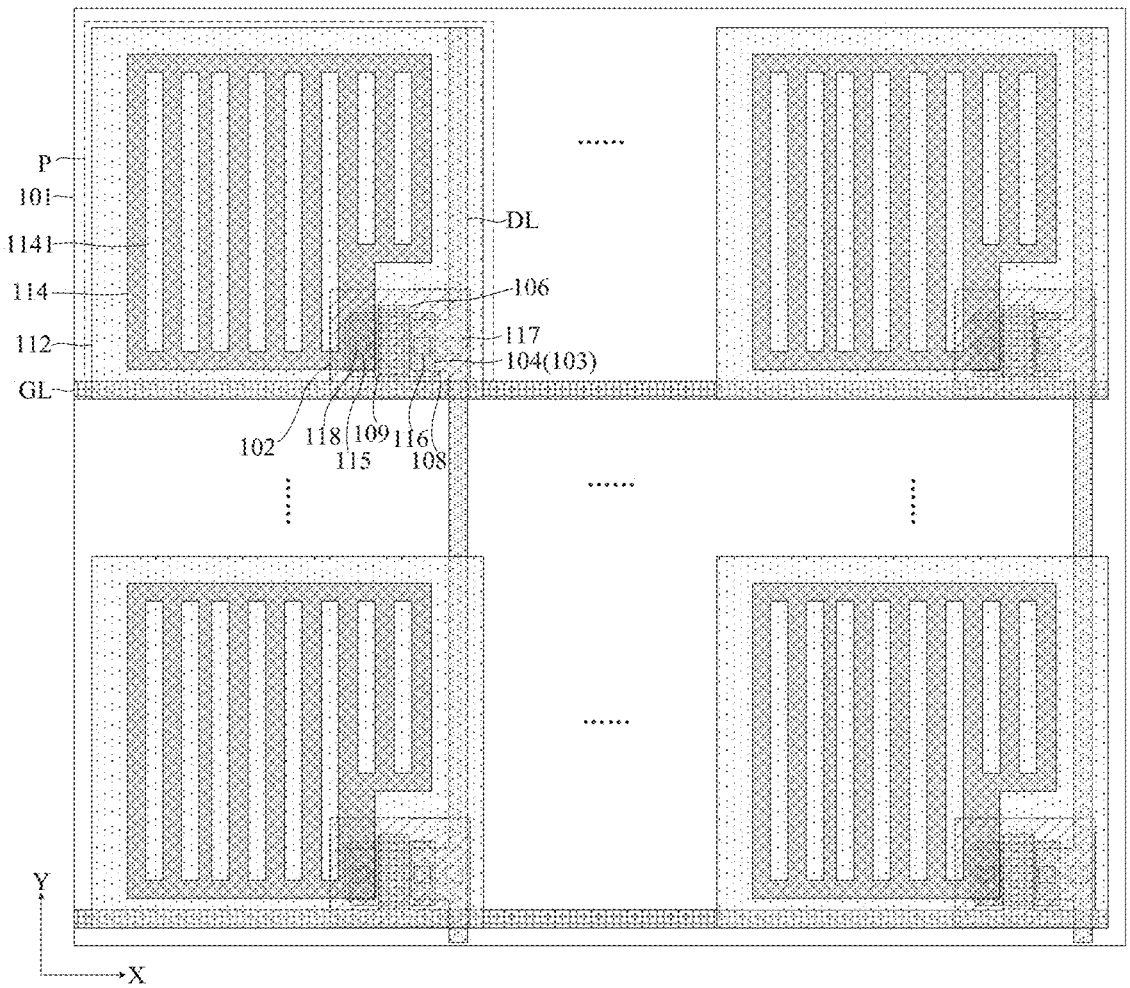
FIG. 3A is a top view illustration of a part of an array substrate, in accordance with some embodiments.
Figure 3B:
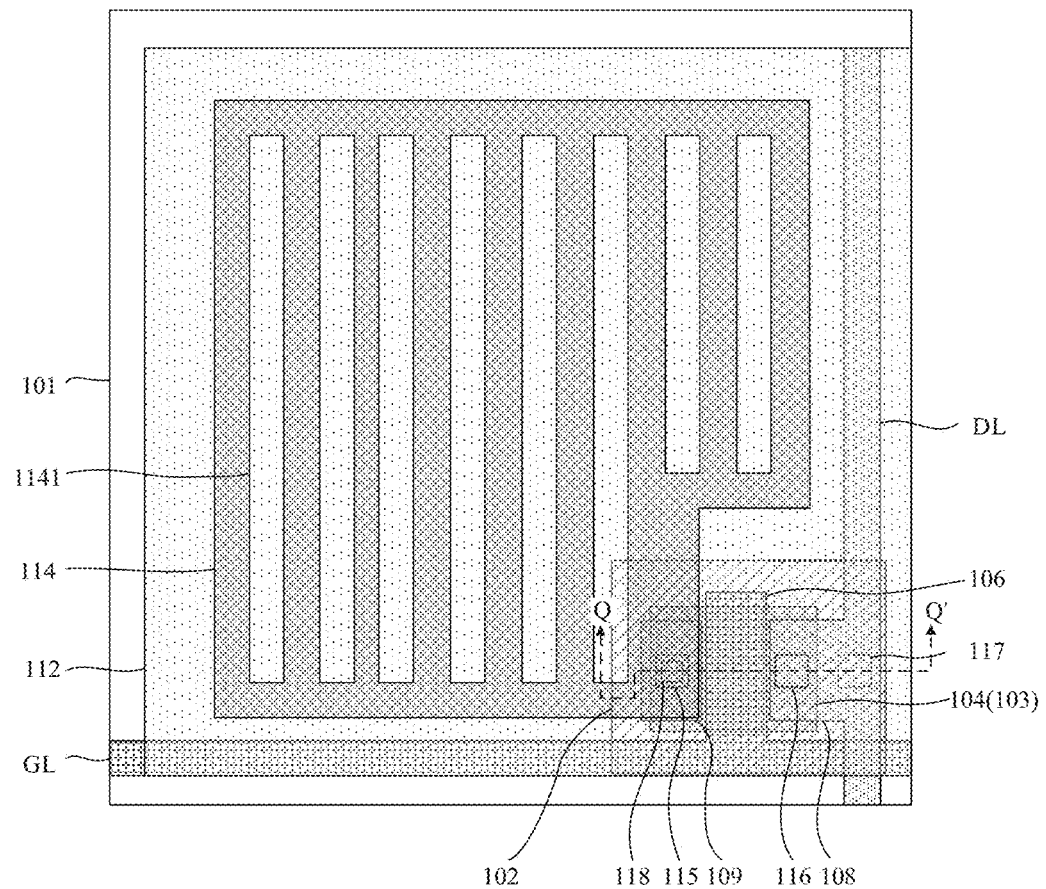
FIG. 3B is an enlarged view of a sub-pixel in FIG. 3A, in accordance with some embodiments.
Figure 4:
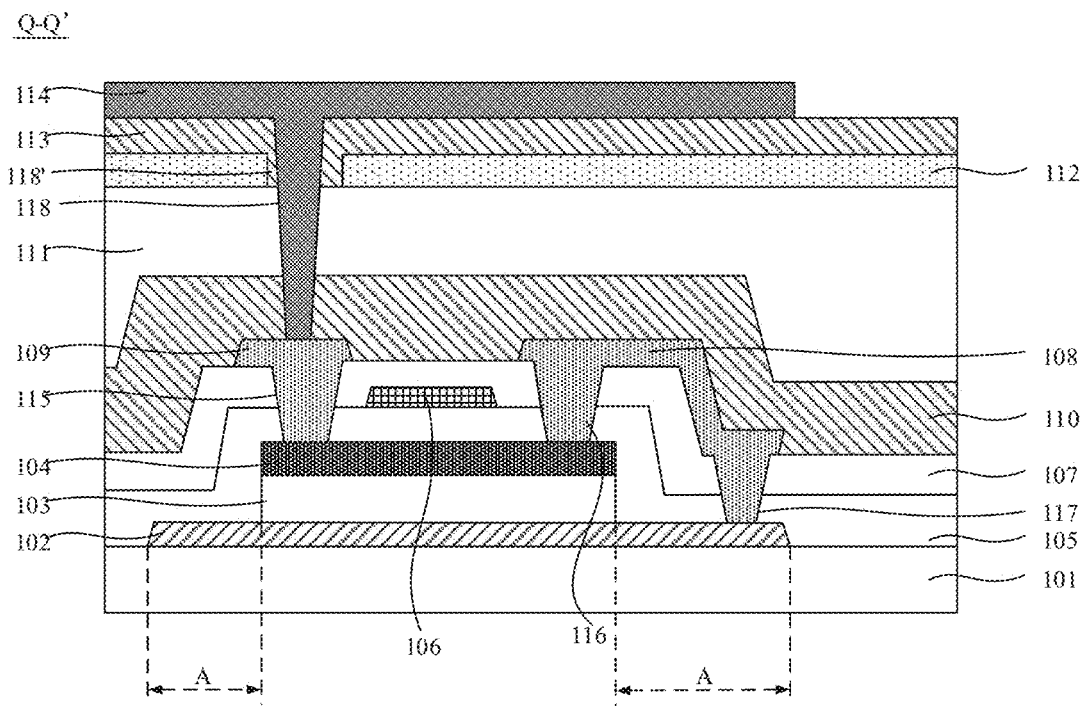
FIG. 4 is a partial sectional view illustration of the array substrate in FIG. 3B taken along the section line Q-Q'.

In some embodiments, as shown in FIGS. 3A, 3B and 4, the array substrate 100 further includes a base substrate 101, and light-shielding (abbreviated as LS) patterns 102, buffer patterns 103 and active layers 104 that are sequentially arranged on the base substrate 101.

It will be noted that in the following embodiments, although structures and connection relationship of components in one sub-pixel P (e.g., a structure of a sub-pixel P shown in FIGS. 3B, 4, 8 to 13, and 15 to 30) of the array substrate 100 are taken as an example for simplicity, as shown in FIG. 3A, the other sub-pixels P of the array substrate 100 may also have this structure. That is, one or more sub-pixel P of the array substrate 100 may have this structure.

In some examples, as shown in FIG. 4, an entire orthographic projection of an active layer 104 on the base substrate 101 coincides with an orthographic projection of at least part of a buffer pattern 103 on the base substrate 101. The buffer pattern 103 is used for isolating the light-shielding pattern 102 and the active layer 104 to insulate the light-shielding pattern 102 from the active layer 104.

It will be noted that, that "the entire orthographic projection of the active layer 104 on the base substrate 101 coincides with the orthographic projection of the at least part of the buffer pattern 103 on the base substrate 101" means that, the entire orthographic projection of the active layer 104 on the base substrate 101 coincides with the orthographic projection of part of the buffer pattern 103 on the base substrate 101 (that is, the orthographic projection of the active layer 104 on the base substrate 101 is within a border of an orthographic projection of the buffer pattern 103 on the base substrate 101), and an area of the orthographic projection of the active layer 104 on the base substrate 101 is less than an area of the orthographic projection of the buffer pattern 103 on the base substrate 101; or the orthographic projection of the active layer 104 on the base substrate 101 coincides with the orthographic projection of the buffer pattern 103 on the base substrate 101, and an area of the orthographic projection of the buffer pattern 103 on the base substrate 101 is equal to an area of the orthographic projection of the active layer 104 on the base substrate 101.

For example, as shown in FIG. 4, the area of the orthographic projection of the buffer pattern 103 on the base substrate 101 is equal to the area of the orthographic projection of the active layer 104 on the base substrate 101. In this case, the border of the orthographic projection of the buffer pattern 103 on the base substrate 101 coincides with or substantially coincides with a border of the orthographic projection of the active layer 104 on the base substrate 101.

In some examples, as shown in FIG. 4, the orthographic projection of the buffer pattern 103 on the base substrate 101 is within a border of an orthographic projection of the light-shielding pattern 102 on the base substrate 101, and the area of the orthographic projection of the buffer pattern 103 on the base substrate 101 is less than an area of the orthographic projection of the light-shielding pattern 102 on the base substrate 101. That is, the orthographic projection of the buffer pattern 103 on the base substrate 101 does not exceed the border of the orthographic projection of the light-shielding pattern 102 on the base substrate 101, and the buffer pattern 103 is entirely located on the light-shielding pattern 102, and does not completely cover the light-shielding pattern 102.

For example, as shown in FIGS. 3B and 4, there is a distance A between a border of the orthographic projection of the buffer pattern 103 on the base substrate 101 and a border of the orthographic projection of the light-shielding pattern 102 on the base substrate 101. For example, each point on the border of the orthographic projection of the buffer pattern 103 on the base substrate 101 has a distance from the border of the orthographic projection of the light-shielding pattern 102 on the base substrate 101, and the buffer pattern 103 does not cover a peripheral portion of the light-shielding pattern 102.

For example, the orthographic projection of the buffer pattern 103 on the base substrate 101 and the orthographic projection of the light-shielding pattern 102 on the base substrate 101 are both in a shape of a rectangle. A minimum distance A between each edge of the border of the orthographic projection of the buffer pattern 103 on the base substrate 101 and a respective edge of the border of the orthographic projection of the light-shielding pattern 102 on the base substrate 101 is equal or substantially equal. As a result, widths of the peripheral portion of the light-shielding pattern 102 (each width is a dimension in a direction perpendicular to a corresponding edge of the orthographic projection of the light-shielding pattern 102 on the base substrate 101) not covered by the buffer pattern 103 may have a good uniformity.

Of course, the orthographic projection of the buffer pattern 103 on the base substrate 101 and the orthographic projection of the light-shielding pattern 102 on the base substrate 101 may have other shapes. In this case, the peripheral portion of the light-shielding pattern 102 not covered by the buffer pattern 103 may also have a substantially same width.

In some examples, a ratio of the area of the orthographic projection of the buffer pattern 103 on the base substrate 101 to the area of the orthographic projection of the light-shielding pattern 102 on the base substrate 101 is in a range from 25% to 40%, such as 28%, 30%, 35%, 38%, etc.

In some embodiments, as shown in FIG. 4, the array substrate 100 further includes a gate insulating layer 105 and a first passivation layer 107 that are sequentially arranged on a side of the active layer 104 away from the base substrate 101. For example, the first passivation layer 107 is farther away from the base substrate 101 than the gate insulating layer 105.

As shown in FIG. 4, the gate insulating layer 105 and the first passivation layer 107 are provided with a first via 115, a second via 116, and a third via 117 that all penetrate the gate insulating layer 105 and the first passivation layer 107. That is, the first via 115 sequentially penetrates the first passivation layer 107 and the gate insulating layer 105, the second via 116 sequentially penetrates the first passivation layer 107 and the gate insulating layer 105, and the third via 117 sequentially penetrates the first passivation layer 107 and the gate insulating layer 105.

The first via 115 is used for exposing a portion of the active layer 104 (e.g., a source region of the active layer 104); and the second via 116 is used for exposing another portion of the active layer 104 (e.g., a drain region of the active layer 104). Or, the first via 115 is used for exposing the another portion of the active layer 104 (e.g., the drain region of the active layer 104); and the second via 116 is used for exposing the portion of the active layer 104 (e.g., the source region of the active layer 104). The third via 117 is used for exposing a portion of the light-shielding pattern 102. For example, an orthographic projection of this portion of the light-shielding pattern 102 on the base substrate 101 is outside the orthographic projection of the buffer pattern 103 on the base substrate 101. That is, this portion of the light-shielding pattern 102 is a portion of the light-shielding pattern 102 that exceeds the buffer pattern 103. For example, as shown in FIG. 4, this portion of the light-shielding pattern 102 is a portion located within the region between the border of the orthographic projection of the light-shielding pattern 102 on the base substrate 101 and the border of the orthographic projection of the buffer pattern 103 on the base substrate 101.

In some examples, as shown in FIG. 4, the gate insulating layer 105 is disposed on a side of the active layer 104 away from the base substrate 101, and orthographic projections of the light-shielding pattern 102, the buffer pattern 103 and the active layer 104 on the base substrate 101 are within an orthographic projection of the gate insulating layer 105 on the base substrate 101. For example, the gate insulating layer 105 covers the light-shielding pattern 102, the buffer pattern 103 and the active layer 104, and the gate insulating layer 105 is in contact with the active layer 104, the buffer pattern 103 and the light-shielding pattern 102.

In some examples, the gate 106 is disposed on a side of the gate insulating layer 105 away from the base substrate 101. For example, an orthographic projection of the gate 106 on the base substrate 101 is within an orthographic projection of the active layer 104 on the base substrate 101. The gate insulating layer 105 is used for isolating the active layer 104 and the gate 106 to insulate the active layer 104 from the gate 106.

As shown in FIG. 4, the second via 116 penetrates the gate insulating layer 105 and the first passivation layer 107, and the third via 117 also penetrates the gate insulating layer 105 and the first passivation layer 107. That is, the second via 116 and the third via 117 penetrate the same layers. Depths of the second via 116 and the third via 117 (i.e., dimensions of the second via 116 and the third via 117 in a thickness direction of the base substrate 101) are equal or substantially equal. That is, a ratio of the depth of the second via 116 to the depth of the third via 117 is 1, or within a small numerical range (e.g., 0.9 to 1.1).

In some examples, the first passivation layer 107 and the gate insulating layer 105 are made of a same material. In this case, the first passivation layer 107 and the gate insulating layer 105 may be etched using a same etching gas to form the first via 115, the second via 116, and the third via 117. For example, the first passivation layer 107 and the gate insulating layer 105 are both made of a material containing silicon oxide, and main components of the etching gas used to etch the first passivation layer 107 and the gate insulating layer 105 include carbon tetrafluoride ($CF_4$) and oxygen ($O_2$). The etching gas may chemically react with the silicon oxide to sequentially etch the first passivation layer 107 and the gate insulating layer 105 to form the first via 115, the second via 116, and the third via 117.

In some embodiments, as shown in FIGS. 3B and 4, the source 108 and the drain 109 are disposed on a side of the first passivation layer 107 away from the base substrate 101. A layer in which the source 108 and the drain 109 are located may be referred to as a source-drain conductive layer. One of the source 108 and the drain 109 (e.g., the drain 109 shown in FIG. 4) is coupled to the active layer 104 through the first via 115; and another of the source 108 and the drain 109 (e.g., the source 108 shown in FIG. 4) is coupled to the active layer 104 through the second via 116, and is also coupled to the light-shielding pattern 102 through the third via 117.

In this way, a voltage of the light-shielding pattern 102 may be the same as a voltage of the source 108 or drain 109 to which it is coupled, so as to prevent the voltage of the light-shielding pattern 102 from being in a floating state, and ensure the stability of the voltage in the array substrate 100.

Figure 2:
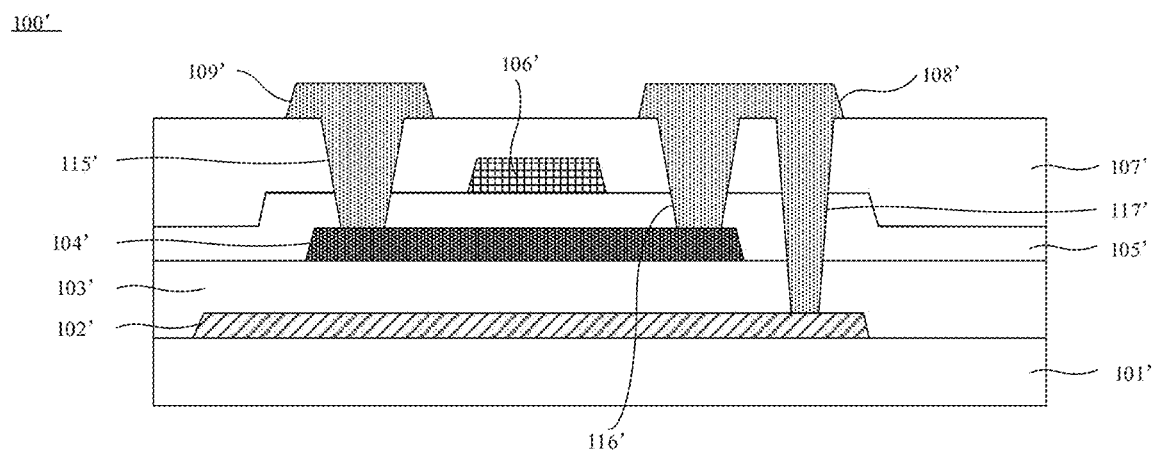
FIG. 2 is a partial sectional view illustration of an array substrate, in accordance with some embodiments.

In the array substrate 100' shown in FIG. 2, a first via 115' and a second via 116' are provided in a first passivation layer 107' and a gate insulating layer 105', and the first via 115' and the second via 116' penetrate the first passivation layer 107' and the gate insulating layer 105'. A third via 117' is provided in the first passivation layer 107', the gate insulating layer 105' and a buffer layer 103', and the third via 117' penetrates the first passivation layer 107', the gate insulating layer 105' and the buffer layer 103'. One of a drain 109' and a source 108' (e.g., the drain 109') is coupled to an active layer 104' through the first via 115', and another of the drain 109' and the source 108' (e.g., the source 108') is coupled to the active layer 104' through the second via 116', and is also coupled to a light-shielding pattern 102' through the third via 117'. Since the second via 116' penetrates the first passivation layer 107' and the gate insulating layer 105', and the third via 117' penetrates the first passivation layer 107', the gate insulating layer 105' and the buffer layer 103' (that is, the second via 116' and the third via 117' penetrate different films), there is a large difference between depths of the second via 116' and the third via 117', so that the difference of etching time required in the process of forming the second via 116' and the third via 117' is large. If the second via 116' and the third via 117' are formed using one patterning process, a problem of over-etching of the active layer 104' may occur due to a large difference between etching time of the second via 116' and etching time of the third via 117'. Therefore, two patterning processes are generally required to form the second via 116' and the third via 117' to avoid the problem of over-etching of the active layer 104'.

However, in the array substrate 100 in the embodiments of the present disclosure, as shown in FIG. 4, since the second via 116 penetrates the first passivation layer 107 and the gate insulating layer 105, and the third via 117 also penetrates the first passivation layer 107 and the gate insulating layer 105 (that is, the second via 116 and the third via 117 penetrate the same films), there is a small difference between depths of the second via 116 and the third via 117, so that the difference of etching time required in the process of forming the second via 116 and the third via 117 is small. In this way, in the process of forming the second via 116 and the third via 117 using one patterning process, the problem of over-etching of the active layer 104 caused by the large difference between the etching time of the second via 116 and the etching time of the third via 117 may be avoided. In addition, using one patterning process to form the second via 116 and the third via 117 may reduce the number of the patterning processes and thus reduce the manufacturing cost of the array substrate 100.

Moreover, since the second via 116 and the third via 117 penetrate the same films, the depths of the second via and the third via may be made equal or substantially equal. Therefore, through one patterning process, time required for forming the second via and the third via is the same or substantially the same, which may further effectively avoid the problem of over-etching of the active layer due to excessive long time required for forming the second via.

In some embodiments, as shown in FIGS. 3A, 3B and 4, the array substrate 100 further includes a second passivation layer 110 and a planarization layer 111 that are sequentially arranged on a side of the first passivation layer 107 away from the base substrate 101.

In some embodiments, as shown in FIGS. 3A, 3B and 4, the array substrate 100 further includes a first electrode layer 112, a third passivation layer 113, and a second electrode layer 114 that are sequentially arranged on a side of the planarization layer 111 away from the base substrate 101. One of the first electrode layer 112 and the second electrode layer 114 is coupled to sources 108 or drains 109 of thin film transistors M in the array substrate 100. As shown in FIG. 4, one of the first electrode layer 112 and the second electrode layer 114 is coupled to a source 108 or a drain 109 of a thin film transistor M in the sub-pixel P.

For example, as shown in FIGS. 3A, 3B and 4, the second electrode layer 114 is coupled to a source 108 or a drain 109 of a thin film transistor M in the sub-pixel P. In this case, the second passivation layer 110, the planarization layer 111, the first electrode layer 112, and the third passivation layer 113 are provided with a fourth via 118 in this sub-pixel P. That is, the fourth via 118 sequentially penetrates the second passivation layer 110, the planarization layer 111, the first electrode layer 112, and the third passivation layer 113. The fourth via 118 is used for exposing at least a part of the source 108 or at least a part of the drain 109 (FIG. 3B shows a case where a part of the drain 109 is exposed). The second electrode layer 114 is coupled to the source 108 or the drain 109 through the fourth via 118 (FIG. 3B shows a case where the second electrode layer 114 is coupled to the drain 109).

In some examples, as shown in FIG. 4, the first electrode layer 112 is provided with a fifth via 118' penetrating the first electrode layer 112, and a part of the third passivation layer 113 is located in the fifth via 118', so that a portion of the second electrode layer 114 in the fourth via 118 is separated from the first electrode layer 112, thereby insulating the first electrode layer 112 from the second electrode layer 114.

In some examples, the second passivation layer 110 and the third passivation layer 113 are made of a same material. In this case, an etching gas may be used to etch the second passivation layer 110 and the third passivation layer 113 to form the fourth via 118. For example, the second passivation layer 110 and the third passivation layer 113 are both made of a material including silicon nitride, and an etching gas, whose main components include carbon tetrafluoride and oxygen, used for etching the second passivation layer 110 and the third passivation layer 113 may chemically react with the silicon nitride, so as to etch the second passivation layer 110 and the third passivation layer 113 to form the fourth via 118.

As described above, the second electrode layer 114 is coupled to a source 108 or a drain 109 of a thin film transistor M in the sub-pixel P. In this case, the second electrode layer 114 serves as a pixel electrode layer and includes a plurality of pixel electrodes, and each pixel electrode is located in a region where a sub-pixel P of the array substrate 100 is located. The pixel electrode is coupled to a source 108 or a drain 109 of a thin film transistor M in this sub-pixel P.

For example, referring to FIG. 3A, the array substrate 100 includes a plurality of thin film transistors M, and each thin film transistors M is located in a sub-pixels P. The second electrode layer 114 is coupled to sources 108 or drains 109 of thin film transistors M in the sub-pixels P. In this case, the second electrode layer 114 serves as a pixel electrode layer and includes a plurality of pixel electrodes, and each pixel electrode is located in a region in which a sub-pixel P of the array substrate 100 is located. The pixel electrode is coupled to a source 108 or a drain 109 of a thin film transistor M in this sub-pixel P. On this basis, the first electrode layer 112 serves as a common electrode layer and may be a layer covering the entire surface of the planarization layer 111. Or the first electrode layer 112 may include a plurality of block-shaped common electrodes, and each block-shaped common electrode is included in a sub-pixel P.

In some other examples, the first electrode layer 112 may be coupled to a source 108 or a drain 109 of a thin film transistor M in the sub-pixel P. In this case, the first electrode layer 112 serves as the pixel electrode layer and includes a plurality of pixel electrodes, and each pixel electrode is located in a region where a sub-pixel P of the array substrate 100 is located. The pixel electrode is coupled to a source 108 or a drain 109 of a thin film transistor M in this sub-pixel P. On this basis, the second electrode layer 114 serves as a common electrode layer and may be, for example, a layer covering the entire surface of the third passivation layer 113. Or, the second electrode layer 114 may include a plurality of block-shaped common electrodes, and each block-shaped common electrode is included in a sub-pixel P.

As shown in FIGS. 3A and 3B, the first electrode layer 112 may include block-shaped electrodes, and the second electrode layer 114 may include block-shaped electrodes, a block-shaped electrode of which located in the sub-pixel P is provided with a plurality of slits 1141. In this way, when voltages are applied to the first electrode layer 112 and the second electrode layer 114, respectively, a horizontal electric field and/or a fringe electric field may be formed therebetween.

For example, the first electrode layer 112 and the second electrode layer 114 may be made of indium tin oxide (abbreviated as ITO). The first electrode layer 112 and the second electrode layer 114 may also be made of other metal oxide conductive materials.

In some other embodiments, the first electrode layer 112 and the second electrode layer 114 may be disposed in a same layer. In this case, the first electrode layer 112 and the second electrode layer 114 both include a plurality of comb-tooth structures each of which includes a plurality of strip-shaped sub-electrodes.

In some other embodiments, the array substrate 100 includes a pixel electrode layer, and a counter substrate of the display device includes a common electrode layer. That is, one of the first electrode layer 112 and the second electrode layer 114 is electrically connected to thin film transistors M and serves as the pixel electrode layer, and another of the first electrode layer 112 and the second electrode layer 114 is arranged in the counter substrate and serves as the common electrode layer.

Figure 5:
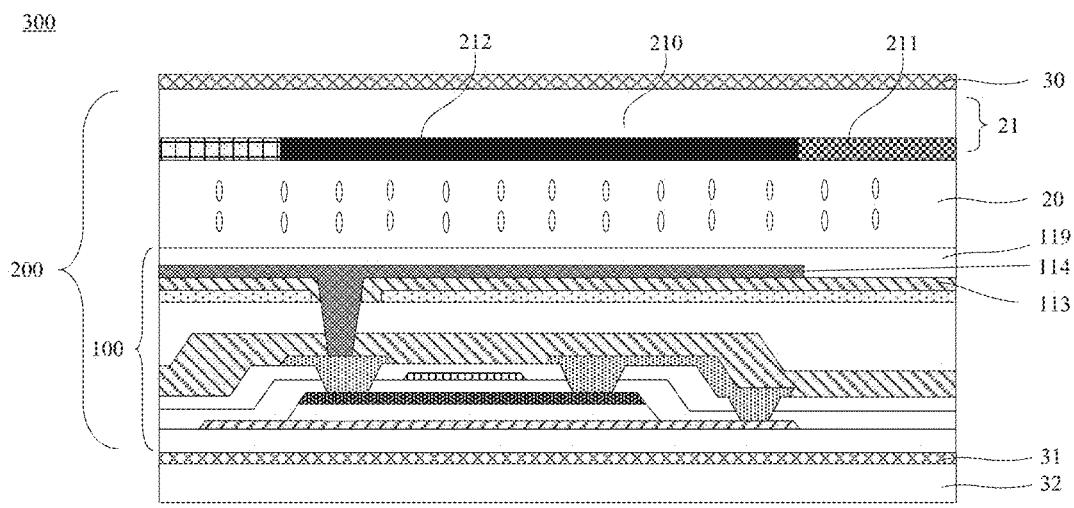
FIG. 5 is a partial sectional view illustration of a display device, in accordance with some embodiments.

In some embodiments, as shown in FIG. 5, the array substrate 100 further includes a protective insulating layer 119 disposed on a side of the second electrode layer 114 away from the base substrate 101. The protective insulating layer 119 may be used for protecting films under the protective insulating layer 119 in the array substrate 100, so as to prevent the films in the array substrate 100 from being affected by the external environment.

Some embodiments of the present disclosure provide a display panel. The display panel may include the array substrate in any of the above embodiments. For example, referring to FIG. 5, the display panel 200 includes the above array substrate 100.

For example, the display panel may be a liquid crystal display panel, an electroluminescent display panel or a photoluminescent display panel.

Some embodiments of the present disclosure provide a display device. The display device may include the display panel in any of the above embodiments. For example, the display panel includes the array substrate in any of the above embodiments.

In some examples, the display device may be a liquid crystal display (abbreviated as LCD) device, an electroluminescent display device or a photoluminescent display device.

For example, the display device is an electroluminescent display device, and the electroluminescent display device may be an organic light-emitting diode (abbreviated as OLED) display device or a quantum dot light-emitting diode (abbreviated as QLED) display device.

For another example, the display device is a photoluminescent display device, and the photoluminescent display device may be a quantum dot photoluminescent display device.

For another example, the display device 300 is a liquid crystal display device. As shown in FIG. 5, the display device 300 includes a display panel 200 and a backlight module 32. The backlight module 32 is configured to provide light required for display to the display panel 200. The display panel 200 includes the array substrate 100 described in any of the above embodiments and a counter substrate 21. The array substrate 100 and the counter substrate 21 are disposed opposite to each other. The display panel 200 further includes a liquid crystal layer 20 disposed between the array substrate 100 and the counter substrate 21. For example, when voltages are applied to the pixel electrode and the common electrode in the array substrate, respectively, an electric field may exist between the pixel electrode and the common electrode. The electric field may drive liquid crystal molecules in the liquid crystal layer 20 within a region where the electric field is located to deflect, so that light is controlled to pass through the liquid crystal layer 20 to travel towards the counter substrate 21, thereby achieving the display of the display device.

In this display panel 200, the buffer pattern 103 in the array substrate 100 does not cover a part of the light-shielding pattern 102, the second via 116 and the third via 117 both penetrate the gate insulating layer 105 and the first passivation layer 107, and the difference of the depths of the second via 116 and the third via 117 is small. In this case, the second via 116 and the third via 117 may be formed through one patterning process, which improves a problem of over-etching of the active layer 104 caused by the large difference between depths of the second via and the third via due to films penetrated by the second via and the third via are different. Moreover, the number of the patterning processes may be reduced, so that the manufacturing cost of the array substrate 100 may be reduced, the production process may be simplified and the production efficiency may be improved.

In some examples, as shown in FIG. 5, the counter substrate 21 includes a base 210 and a color filter layer 211 disposed on the base 210. In this case, the counter substrate 21 may also be referred to as a color filter (CF) substrate.

For example, the color filter layer 211 includes a plurality of photoresist units. The plurality of photoresist units may include at least photoresist units of a first color, photoresist units of a second color, and photoresist units of a third color. The photoresist units of the first color may allow light of the first color to pass through, the photoresist units of the second color may allow light of the second color to pass through, and the photoresist units of the third color may allow light of the third color to pass through.

For example, the first color, the second color, and the third color are three primary colors, such as red, green and blue, respectively.

For example, the plurality of sub-pixels P in the array substrate 100 may include sub-pixels of the first color, sub-pixels of the second color, and sub-pixels of the third color. The photoresist unit of the first color corresponds to the sub-pixel of the first color, and thus a color of light exiting from the sub-pixel of the first color is the first color. The photoresist unit of the second color corresponds to the sub-pixel of the second color, and thus a color of light exiting from the sub-pixel of the second color is the second color. The photoresist unit of the third color corresponds to the sub-pixel of the third color, and thus a color of light exiting from the sub-pixel of the third color is the third color.

In some examples, the counter substrate 21 further includes a black matrix 212 disposed on the base 210. The black matrix 212 is used for separating the plurality of photoresist units. For example, the black matrix 212 separates red photoresist units, green photoresist units and blue photoresist units to avoid crosstalk between colors of light exiting from the sub-pixels of different colors and to ensure the display effect.

In some embodiments, as shown in FIG. 5, the display panel 200 further includes a first polarization structure 30 disposed on a side of the counter substrate 21 away from the liquid crystal layer 20, and a second polarization structure 31 disposed on a side of the array substrate 100 away from the liquid crystal layer 20.

In some examples, the first polarization structure 30 and the second polarization structure 31 may each include a polarizer or a metal linear polarizer. Mutual relationship and specific values of transmission axes of the first polarization structure 30 and the second polarization structure 31 may be designed according to practical situations, and are not limited herein. For example, the transmission axis of the first polarization structure 30 and the transmission axis of the second polarization structure 31 are perpendicular to or parallel to each other.

For example, the above display device may be a high transmission rate advanced super dimension switch (HADS) type, an advanced super dimension switch (ADS) type, an in-plane switching (IPS) type, a fringe field switching (FFS) type, a twisted nematic (TN) type, a multi-domain vertical alignment (MVA) type, or a patterned vertical alignment (PVA) type liquid crystal display device.

For example, the display device may be any device that displays images whether in motion (e.g., videos) or stationary (e.g., static images), and whether literal or graphical. More specifically, it is anticipated that the described embodiments may be implemented in or associated with a variety of electronic devices. The variety of electronic devices may include (but not limit to), for example, a mobile telephone, a wireless device, a personal data assistant (PAD), a hand-held or portable computer, a global positioning system (GPS) receiver/navigator, a camera, a MPEG-4 Part 14

(MP4) video player, a video camera, a game console, a watch, a clock, a calculator, a TV monitor, a flat-panel display, a computer monitor, a car display (such as an odometer display), a navigator, a cockpit controller and/or display, a camera view display (such as a rear view camera display in a vehicle), an electronic photo, an electronic billboard or sign, a projector, a building structure, and a packaging and an aesthetic structure (such as a display for an image of a piece of jewelry).

Figure 6:
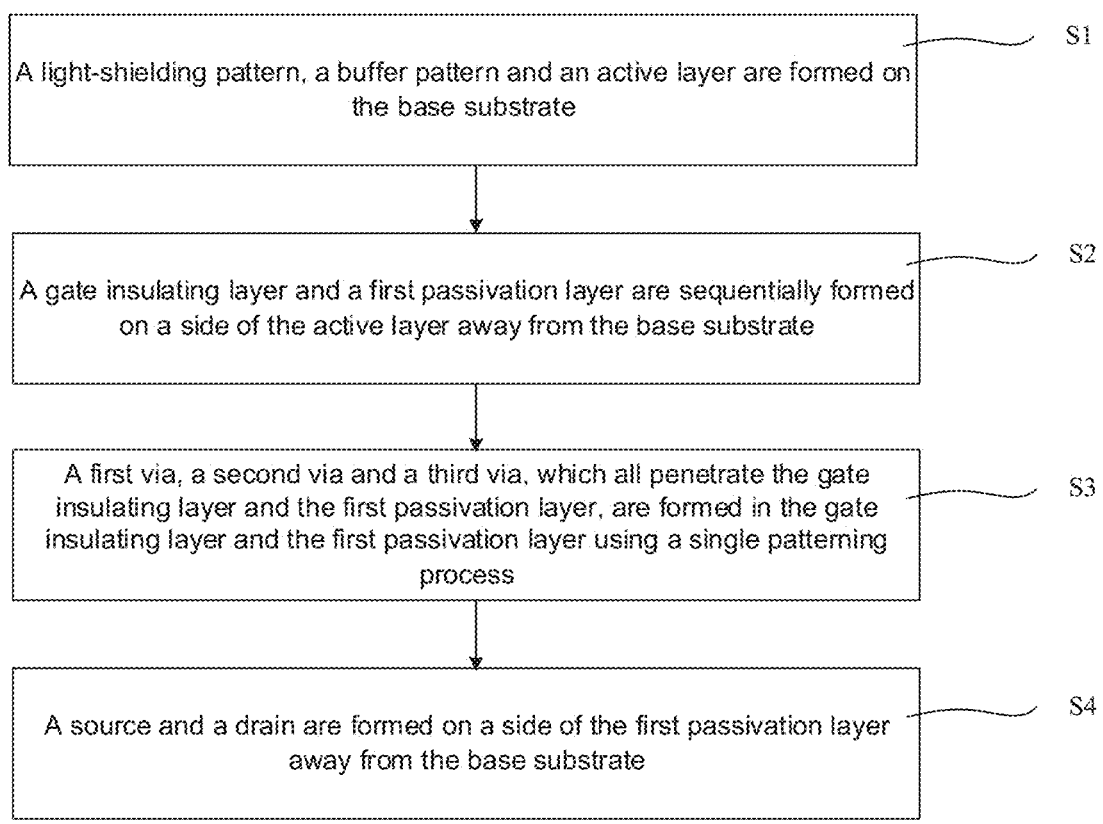
FIG. 6 is a flow diagram of a method for manufacturing an array substrate, in accordance with some embodiments.

Some embodiments of the present disclosure provide a method for manufacturing an array substrate. The array substrate may be the array substrate 100 in any of the above embodiments. As shown in FIG. 6, the method includes S1 to S4.

It will be noted that, although formation processes of components in a sub-pixel (e.g., the sub-pixel shown in FIGS. 8 to 13, and 15 to 30) are taken as example to describe the method for simplicity in some embodiments, it will be understood that, when a component in this sub-pixel is formed, same components in other sub-pixels may be formed simultaneously.

In S1, a light-shielding pattern, a buffer pattern and an active layer are formed on the base substrate.

Figure 12A:
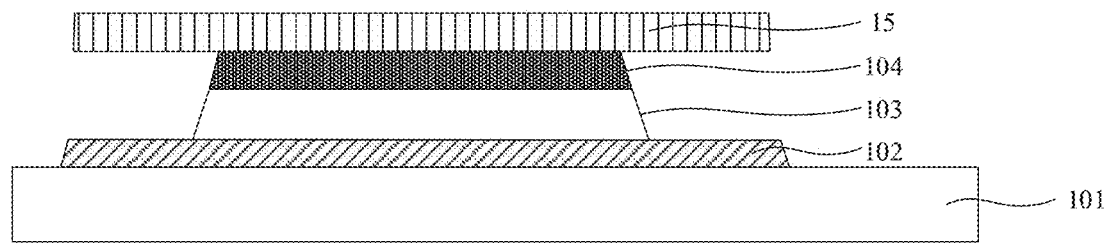

As shown in FIG. 12A, an entire orthographic projection of the active layer 104 on the base substrate 101 coincides with an orthographic projection of at least part of the buffer pattern 103 on the base substrate 101. The orthographic projection of the buffer pattern 103 on the base substrate 101 is within a border of an orthographic projection of the light-shielding pattern 102 on the base substrate 101, and an area of the orthographic projection of the buffer pattern 103 on the base substrate 101 is less than an area of the orthographic projection of the light-shielding pattern 102 on the base substrate 101.

Figure 7:
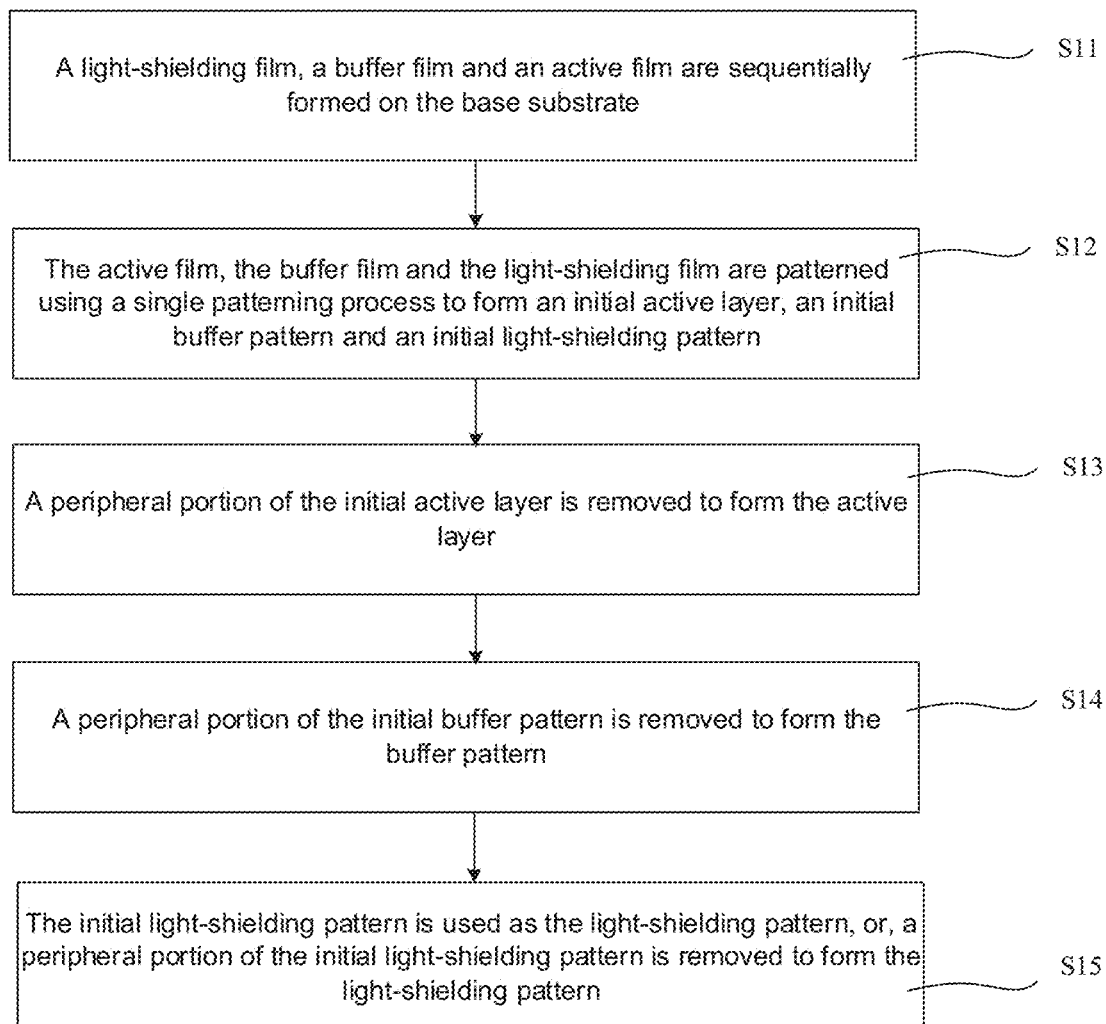
FIG. 7 is a flow diagram of a process of forming a light-shielding pattern, a buffer pattern and an active layer, in accordance with some embodiments.

In some embodiments, as shown in FIG. 7, S1 includes S11 to S15.

In S11, a light-shielding film, a buffer film and an active film are sequentially formed on the base substrate.

Figure 8:
FIGS. 8 to 13 are schematic diagrams illustrating a process of forming a light-shielding pattern, a buffer pattern and an active layer, in accordance with some embodiments.

In some examples, referring to FIG. 8, the light-shielding film 2, the buffer film 3, and the active film 4 may be sequentially formed on the base substrate 101 using film deposition processes. For example, the film deposition process may include chemical vapor deposition (abbreviated as CVD), plasma enhanced chemical vapor deposition (abbreviated as PECVD), magnetron sputtering, etc.

In S12, the active film, the buffer film and the light-shielding film are patterned using a single patterning process (i.e., a second patterning process) to form an initial active layer, an initial buffer pattern and an initial light-shielding pattern.

In some embodiments, during the patterning process of the active film, the buffer film, and the light-shielding film, S12 includes: as shown in FIG. 8, forming a photoresist film 5 on a side of the active film 4 away from the base substrate 101.

Figure 9:
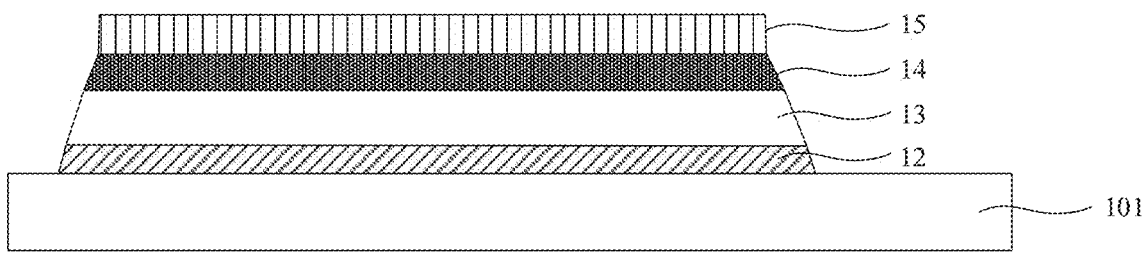

After the initial active layer 14 is formed, as shown in FIG. 9, a photoresist layer 15 covers a surface of the initial active layer 14 away from the base substrate 101, and does not cover a side face of the initial active layer 14 to facilitate subsequent etching, i.e., removing the peripheral portions of the initial active layer 14, the initial buffer pattern 13 and the initial light-shielding pattern 12.

It will be noted that, the "patterning process" described herein may refer to a photoresist (abbreviated as PR) process, including PR coating, PR development and PR stripping. PR coating is to coat a layer of PR (e.g., the photoresist film 5) on a surface of the film to be patterned on the base substrate. After the PR coating, the PR process further includes an exposure process, i.e., using a mask to selectively irradiate the PR with ultraviolet rays. PR development refers to using developer liquid to remove PR in a portion that is exposed to light or a portion that is not illuminated, so that a pattern of the mask is transferred to the PR to form a pattered PR (e.g., the photoresist layer 15). After the PR development, the PR process further includes a wet etching process or a dry etching process, i.e., with the patterned PR as a mask, using the wet etching process or the dry etching process to etch the film to be patterned on the base substrate. PR stripping means that, after the etching is completed, the patterned PR is removed with a stripping liquid to complete the photoresist process.

S13, a peripheral portion of the initial active layer is removed to form the active layer.

Figure 10:
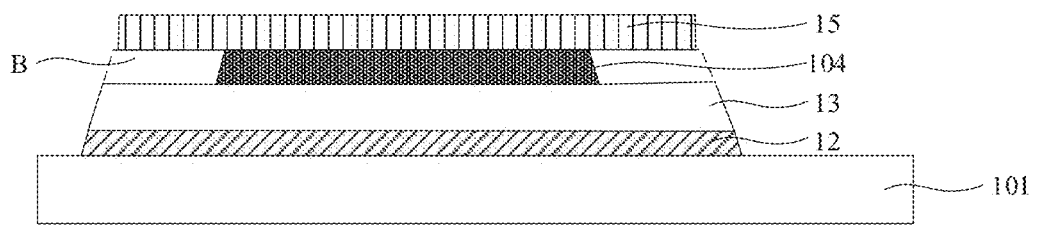
Figure 11:
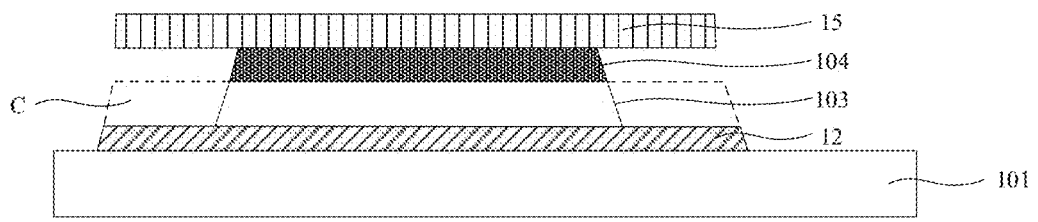

For example, as shown in FIGS. 10 and 11, with the photoresist layer 15 as a protective layer, a wet etching process is used to etch from a side face of the initial active layer 14 to remove a peripheral portion B of the initial active layer 14 to form the active layer 104.

It will be noted that the initial buffer pattern 13 and the initial light-shielding pattern 12 cannot be etched while the initial active layer 14 is etched herein. Therefore, a wet etching process may be used, in which an etching solution used in the wet etching process may dissolve the initial active layer 14 but cannot dissolve the initial buffer pattern 13 and the initial light-shielding pattern 12, thereby avoiding the influence on the subsequent etching of the initial buffer pattern 13 and the initial light-shielding pattern 12. For example, main components of the etching solution used in the wet etching process include nitric acid, acetic acid, or phosphoric acid.

S14, a peripheral portion of the initial buffer pattern is removed to form the buffer pattern.

For example, as shown in FIGS. 10 and 11, with the photoresist layer 15 as a protective layer, a dry etching process is used to remove a peripheral portion C of the initial buffer pattern 13 not covered by the photoresist layer 15 to form the buffer pattern 103.

It will be noted that the active layer 104 and the initial light-shielding pattern 12 cannot be etched while the initial buffer pattern 13 is etched herein. Since the dry etching process is anisotropic, and the etching position may be selected according to the needs, the dry etching process may be used to etch the initial buffer pattern 13, and the etching gas used cannot etch the active layer 104 and the initial light-shielding pattern 12, thereby avoiding over-etching of the active layer 104 and avoiding the influence on the subsequent etching of the initial light-shielding pattern 12. For example, the etching gas used in the dry etching process is chlorine gas.

In S15, the initial light-shielding pattern is used as the light-shielding pattern, or, a peripheral portion of the initial light-shielding pattern is removed to form the light-shielding pattern.

In some examples, the initial light-shielding pattern 12 formed by using the patterning process in S12 meets the dimension requirement, and in S15, as shown in FIGS. 11 and 12A, the initial light-shielding pattern 12 may be used as the light-shielding pattern 102. Or, in S15, as shown in FIGS. 11 and 12B, a peripheral portion D of the initial light-shielding pattern 12 is etched away to form the light-shielding pattern 102, so as to improve the dimensional accuracy of the light-shielding pattern 12.

It can be seen from the above S11 to S15 that a single patterning process may be used to form the light-shielding pattern 102, the buffer pattern 103 and the active layer 104 on the base substrate 101, so as to effectively control the cost of the patterning process.

Figure 12B:
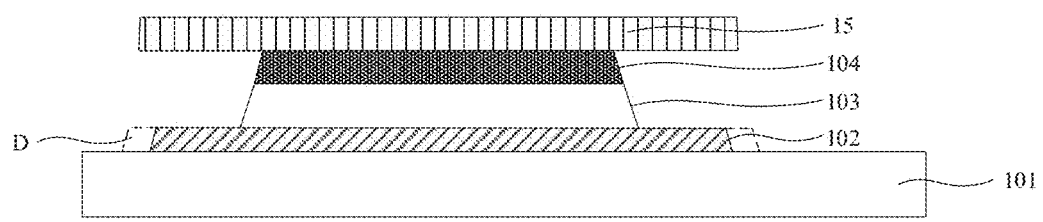
Figure 13:
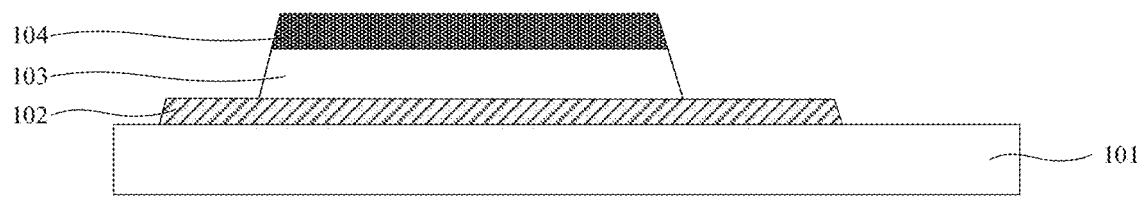

After S15, S1 may further include: as shown in FIGS. 12A, 12B and 13, stripping off the photoresist layer 15. For example, the photoresist layer 15 is dissolved using a stripping liquid, so that it is stripped off from the surface of the active layer 104.

For example, compared to a case where the patterning processes used for manufacturing the array substrate 100' shown in FIG. 2 include two patterning processes for forming the light-shielding pattern 102' and the active layer 104', the patterning processes used for manufacturing the array substrate 100 in the embodiments of the present disclosure includes one patterning process for forming the light-shielding pattern 102, the buffer pattern 103 and the active layer 104, so that the number of the patterning processes is reduced, thereby simplifying the process and saving the manufacturing cost.

Figure 14:
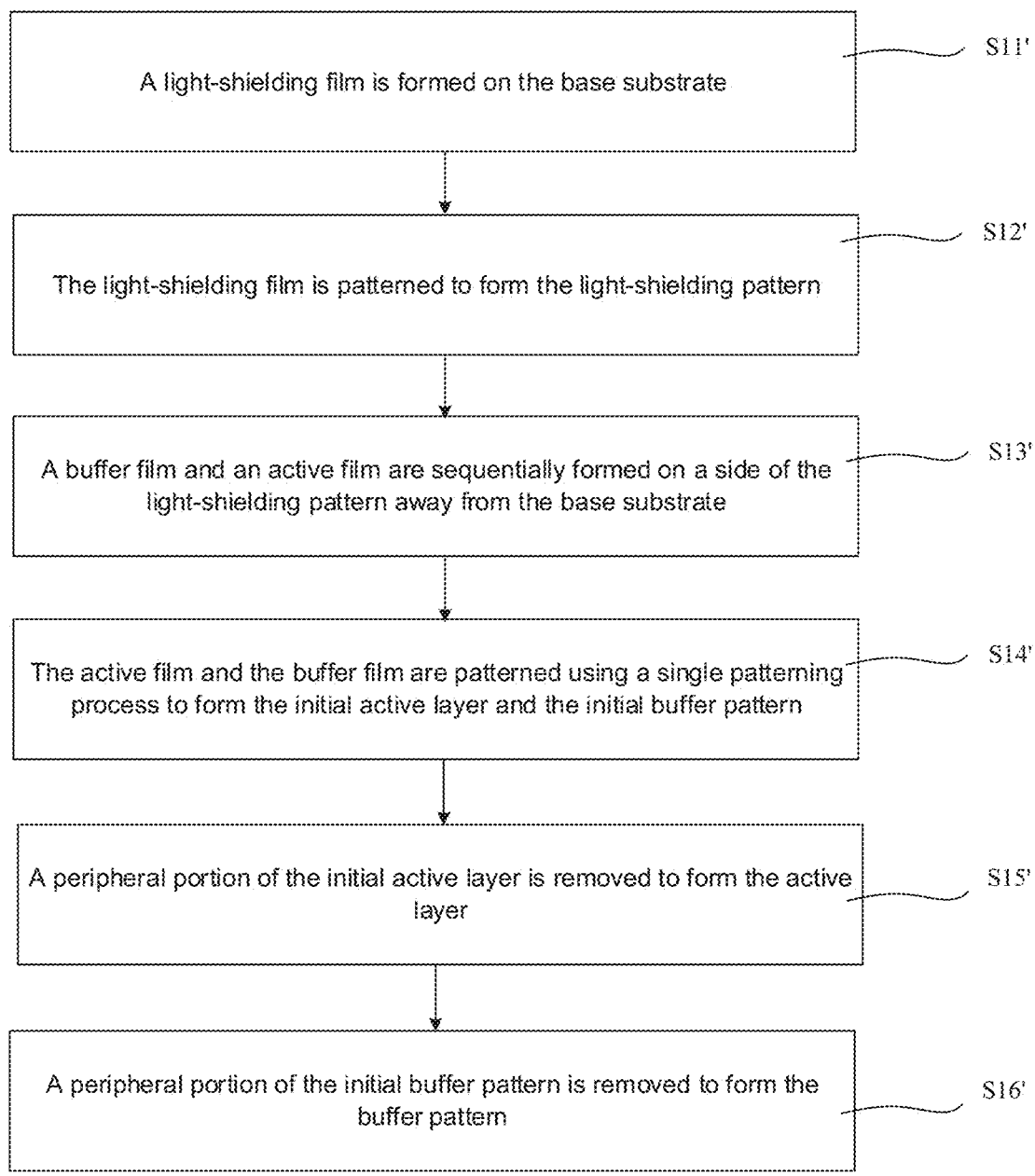
FIG. 14 is a flow diagram of another process of forming a light-shielding pattern, a buffer pattern and an active layer, in accordance with some embodiments.

In some other embodiments, as shown in FIG. 14, the above S1 further includes S11' to S16'.

In S11', a light-shielding film is formed on the base substrate.

Figure 15:
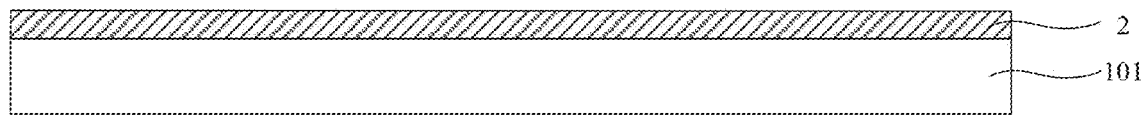
FIGS. 15 to 21 are schematic diagrams illustrating another process of forming a light-shielding pattern, a buffer pattern and an active layer, in accordance with some embodiments.

For example, as shown in FIG. 15, the light-shielding film 2 is formed on the base substrate 101 by using a film deposition process.

In S12', the light-shielding film is patterned to form the light-shielding pattern.

Figure 16:
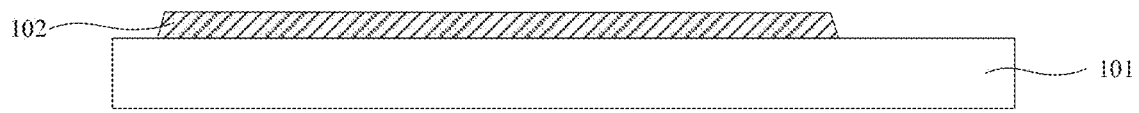

For example, as shown in FIGS. 15 and 16, the light-shielding film 2 is patterned by using a patterning process (including a photolithography process) to form the light-shielding pattern 102. The etching process used in the patterning process may be a wet etching process or a dry etching process. In this way, the influence of the formations of the buffer pattern 103 and the active layer 104 on the formation of the light shielding pattern 102 may be avoided, interference factors may be reduced, and the adjustment of the critical dimension bias (abbreviated as CD bias) of the light-shielding film 2 may be facilitated, so as to improve the dimensional accuracy of the light-shielding pattern 102.

In S13', a buffer film and an active film are sequentially formed on a side of the light-shielding pattern away from the base substrate.

Figure 17:
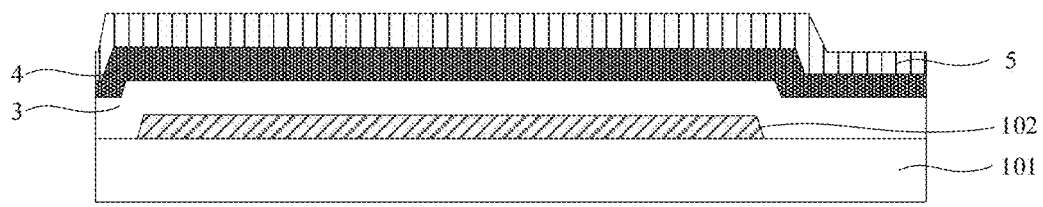

For example, as shown in FIG. 17, the buffer film 3 and the active film 4 may be sequentially formed on the light-shielding pattern 102 by using film deposition processes.

In S14', the active film and the buffer film are patterned using a single patterning process (i.e., a third patterning process) to form the initial active layer and the initial buffer pattern.

Figure 18:
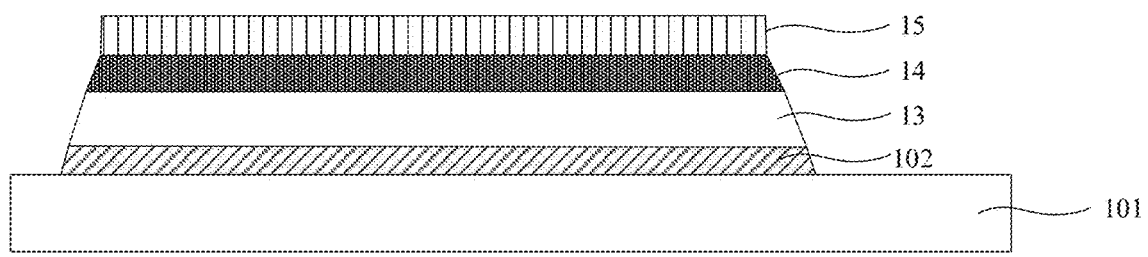

During the patterning process of the active film and the buffer film, S14' includes: as shown in FIGS. 17 and 18, forming a photoresist film 5 on the active film 4.

After the initial active layer 14 is formed, a photoresist layer 15 covers a surface of the initial active layer 14 away from the base substrate 101, and does not cover a side face of the initial active layer 14 to facilitate subsequent etching, i.e., removing the peripheral portions of the initial active layer 14, the initial buffer pattern 13 and the initial light-shielding pattern 12.

In S15', a peripheral portion of the initial active layer is removed to form the active layer. For example, as shown in FIGS. 18 and 19, a peripheral portion E of the initial active layer 14 is etched away to form the active layer 104.

Figure 19:
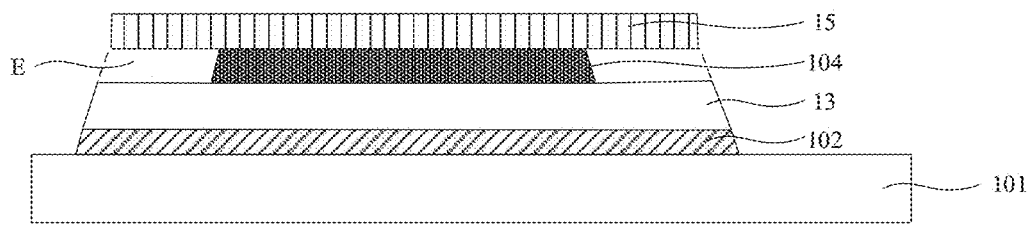

For example, referring to FIG. 19, the method for forming the active layer 104 in S15' is the same as the method for forming the active layer 104 in S13, which will not be repeated herein, and the embodiments of the present disclosure are not limited thereto.

In S16', a peripheral portion of the initial buffer pattern is removed to form the buffer pattern. For example, as shown in FIGS. 19 and 20, a peripheral portion F of the initial buffer pattern 13 is etched away to form the buffer pattern 103.

Figure 20:
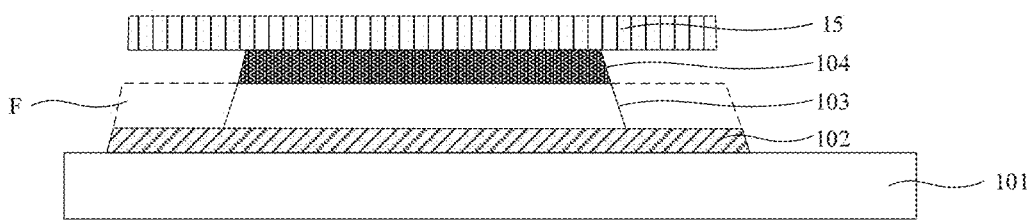

For example, referring to FIG. 20, the method for forming the buffer pattern 103 in S16' is the same as the method for forming the buffer pattern 103 in S14', which will not be repeated herein, and the embodiments of the present disclosure are not limited thereto.

Figure 21:
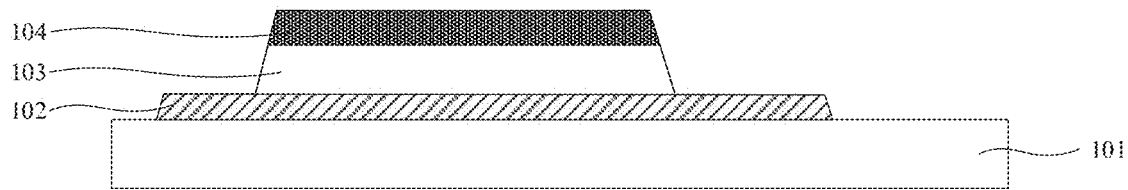

In some embodiments, after S16', S1 further includes: as shown in FIGS. 20 and 21, stripping off the photoresist layer 15 with a stripping liquid.

In the above S11' to S16', by separately forming the light-shielding pattern 102, the dimensional accuracy of manufacturing the light-shielding pattern 102 may be improved.

In S2, a gate insulating layer and a first passivation layer are sequentially formed on a side of the active layer away from the base substrate.

Figure 22:
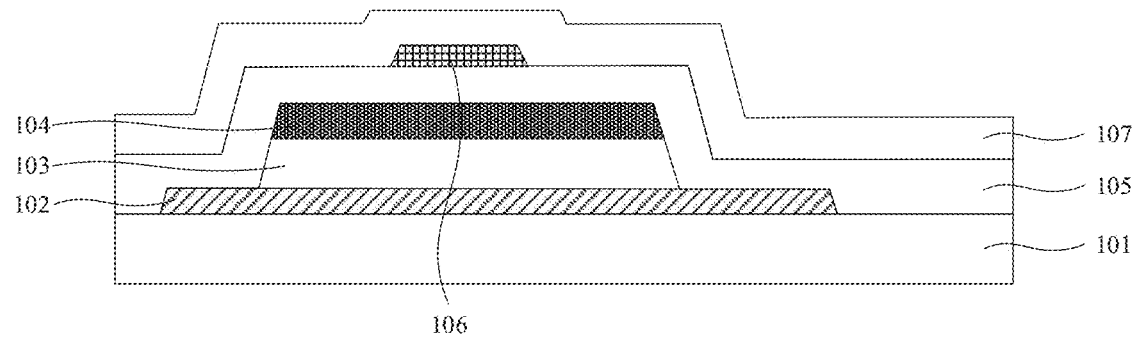
FIG. 22 is a schematic diagram illustrating a process of forming a gate insulating layer and a first passivation layer, in accordance with some embodiments.

For example, as shown in FIG. 22, it is possible to use film deposition processes to sequentially form the gate insulating layer 105 and the first passivation layer 107 on a side of the active layer 104 away from the base substrate 101.

In some embodiments, after forming the gate insulating layer 105 and before forming the first passivation layer 107, the method for manufacturing the array substrate 100 further includes: as shown in FIG. 22, forming a gate conductive layer on a side of the gate insulating layer 105 away from the base substrate 101. The gate conductive layer is patterned using a patterning process to form the gate 106 and the gate line GL. The etching process in the patterning process may be, for example, a wet etching process.

In S3, a first via, a second via and a third via, which all penetrate the gate insulating layer and the first passivation layer, are formed in the gate insulating layer and the first passivation layer using a single patterning process (i.e., a first patterning process).

Figure 23:
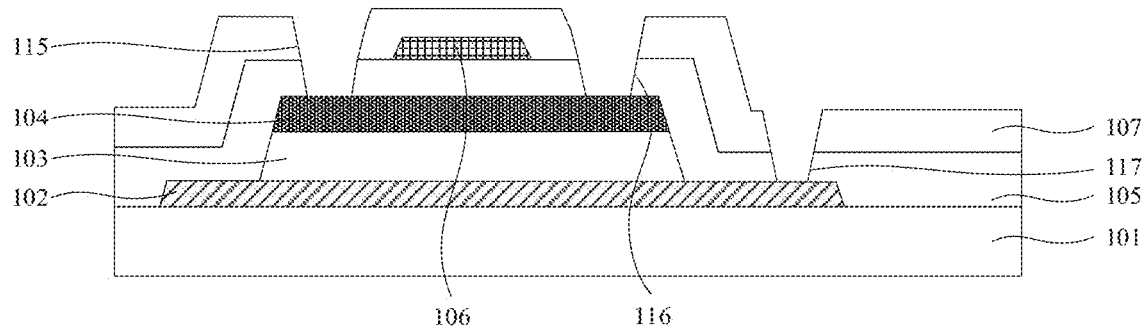
FIG. 23 is a schematic diagram illustrating a process of forming a first via, a second via and a third via, in accordance with some embodiments.

For example, as shown in FIG. 23, a wet etching process may be used to form the first via 115, the second via 116, and the third via 117 in the gate insulating layer 105 and the first passivation layer 107. The first via 115 and the second via 116 expose portions of the active layer 104 (the source region and the drain region of the active layer 104), respectively, and the third via 117 exposes a portion of the light-shielding pattern 102.

For example, compared to a case where the pattering processes used for manufacturing the array substrate 100' shown in FIG. 2 include the patterning process for forming the first via 115' and the second via 116', and the patterning process for forming the third via 117', referring to FIG. 4, the patterning processes for manufacturing the array substrate 100 in the embodiments of the present disclosure includes one patterning process for forming the first via 115, the second via 116, and the third via 117, so that the number of patterning processes may be reduced, so as to simplify the process and save manufacturing cost.

In S4, a source and a drain are formed on a side of the first passivation layer away from the base substrate.

Figure 24:
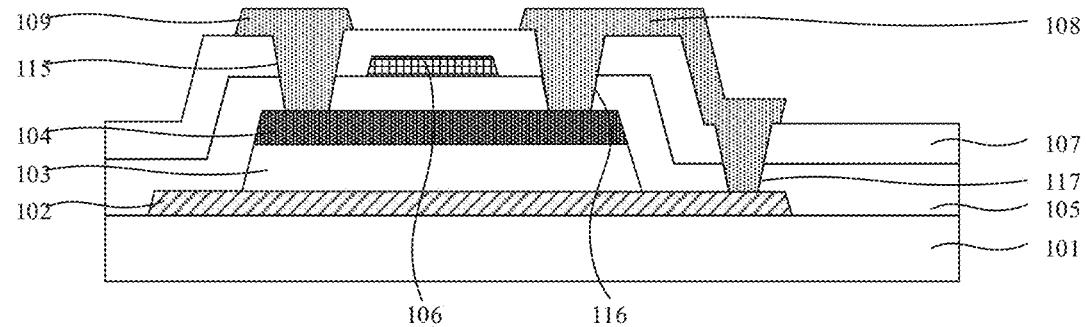
FIG. 24 is a schematic diagram illustrating a process of forming a source and a drain, in accordance with some embodiments.

For example, a source-drain conductive layer is formed on a side of the first passivation layer 107 away from the base substrate 101 using a film deposition process. As shown in FIG. 24, the source-drain conductive layer is patterned using a wet etching process to form the source 108 and the drain 109. One of the source 108 and the drain 109 (e.g., the drain 109) is coupled to the active layer 104 through the first via 115, and another of the source 108 and the drain 109 (e.g., the source 108) is coupled to the active layer 104 through the second via 116, and is also coupled to the light-shielding pattern 102 through the third via 117.

Some steps in the above method are for manufacturing films of the thin film transistor M in the array substrate 100. In addition, the array substrate 100 further includes a plurality of films that are located on the thin film transistor M, and structures of the plurality of films may be referred to the above description. Hereinafter, the structure shown in FIG. 4 is taken as an example to describe a method for manufacturing a plurality of films located on the thin film transistor M.

In some embodiments, after forming the source 108 and the drain 109 on a side of the first passivation layer 107 away from the base substrate 101, the method for manufacturing the array substrate 100 further includes: sequentially forming the second passivation layer 110, the planarization layer 111, the first electrode layer 112, and the third passivation layer 113 on a side of the first passivation layer 107 away from the base substrate 101 using film deposition processes.

Figure 25:
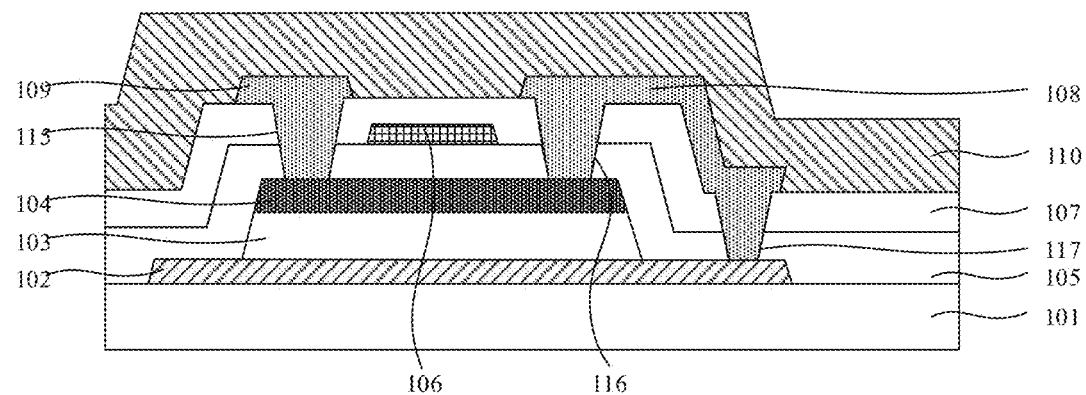
FIG. 25 is a schematic diagram illustrating a process of forming a second passivation layer, in accordance with some embodiments.

For example, as shown in FIG. 25, the second passivation layer 110 is formed on a side of the first passivation layer 107 away from the base substrate 101.

Figure 26:
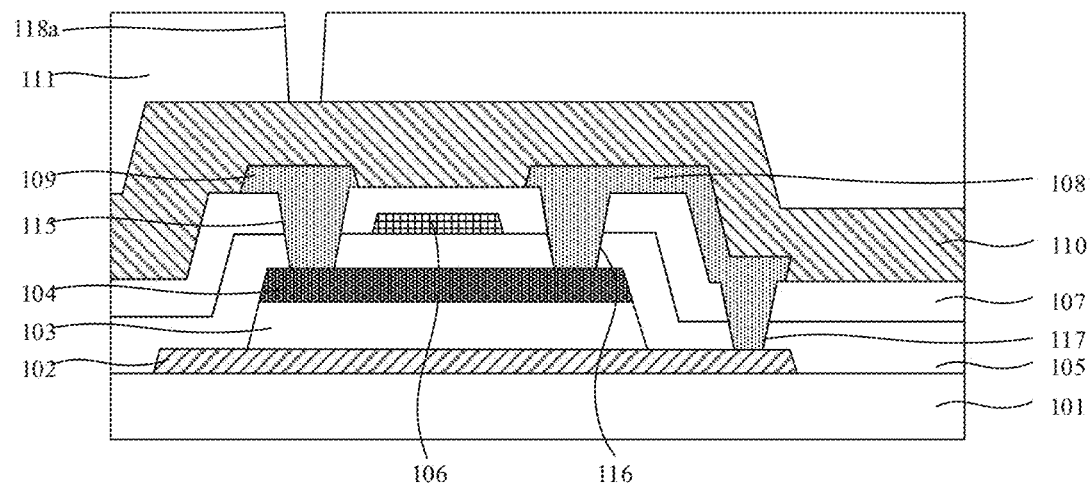
FIG. 26 is a schematic diagram illustrating a process of forming a planarization layer, in accordance with some embodiments.

For example, as shown in FIG. 26, the planarization layer 111 is formed on a side of the second passivation layer 110 away from the base substrate 101. After the planarization layer 111 is formed, a patterning process may be used to etch the planarization layer 111 to form a via 118a.

Figure 27:
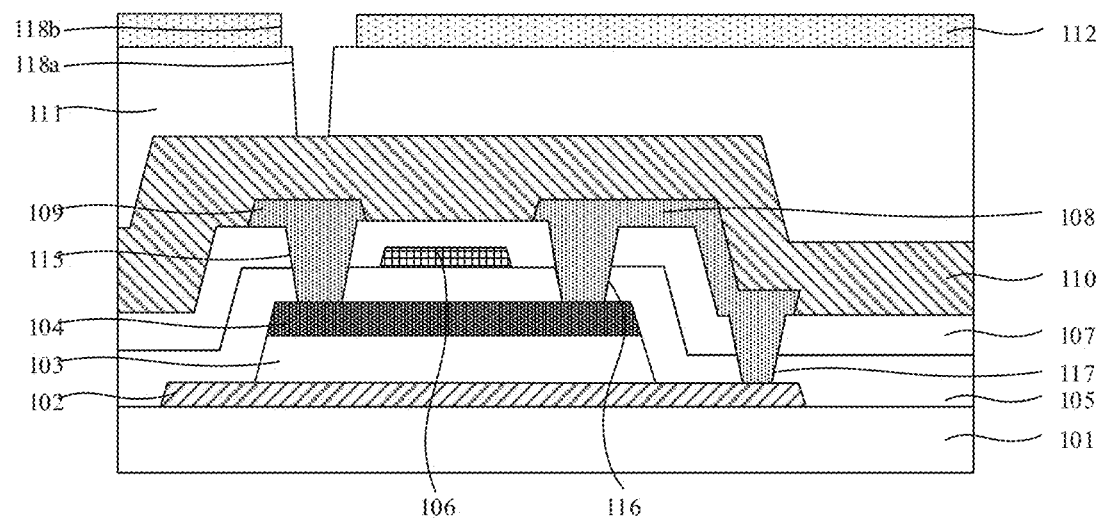
FIG. 27 is a schematic diagram illustrating a process of forming a first electrode layer, in accordance with some embodiments.

For example, as shown in FIG. 27, the first electrode layer 112 is formed on a side of the planarization layer 111 away from the base substrate 101. After the first electrode layer 112 is formed, a pattering process may be used to etch the first electrode layer 112 to form a via 118b. The via 118b and the via 118a are interconnected with each other, and a diameter of the via 118b is greater than a diameter of the via 118a.

Figure 28:
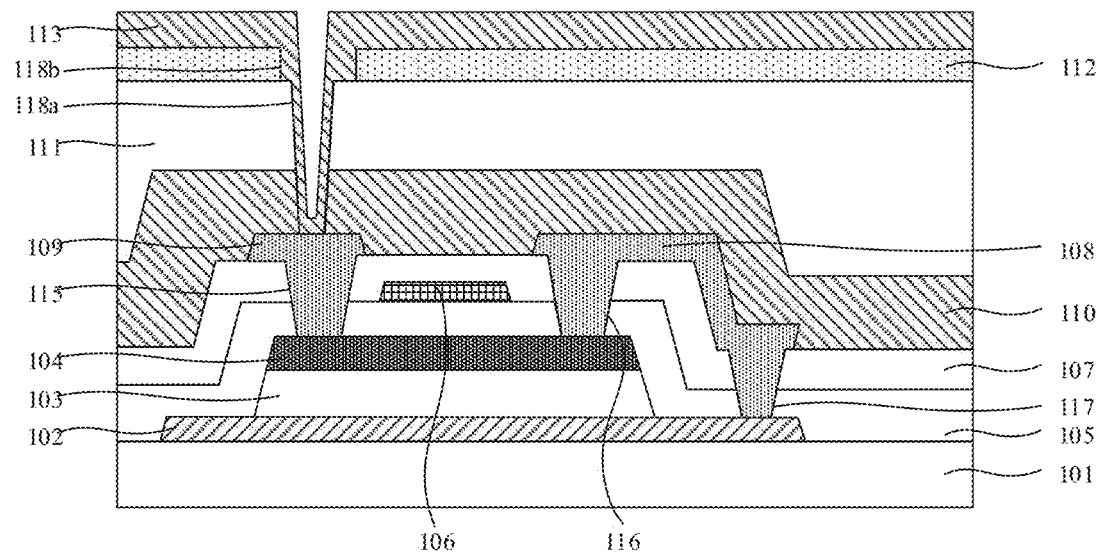
FIG. 28 is a schematic diagram illustrating a process of forming a third passivation layer, in accordance with some embodiments.

For example, as shown in FIG. 28, the third passivation layer 113 is formed on a side of the first electrode layer 112 away from the base substrate 101. A portion of the third passivation layer 113 is deposited within the via 118a and the via 118b in the planarization layer 111 and the first electrode layer 112.

Through the above method, patterning processes may be used to etch the planarization layer 111 and the first electrode layer 112 to form the via 118a and the via 118b. In this way, in a process of forming the third passivation layer 113 on the first electrode layer 112, a portion of the third passivation layer 113 is deposited in the via 118a and the via 118b penetrating the planarization layer 111 and the first electrode layer 112 to facilitate subsequent etching of the second passivation layer 110 and the third passivation layer 113 using a single patterning process.

A fourth via 118 is formed in the second passivation layer 110, the planarization layer 111, the first electrode layer 112, and the third passivation layer 113 using a single patterning process. The fourth via 118 sequentially penetrates the second passivation layer 110, the planarization layer 111, the first electrode layer 112, and the third passivation layer 113, and the fourth via 118 exposes at least a portion of the source 108 or at least a portion of the drain 109.

Figure 29:
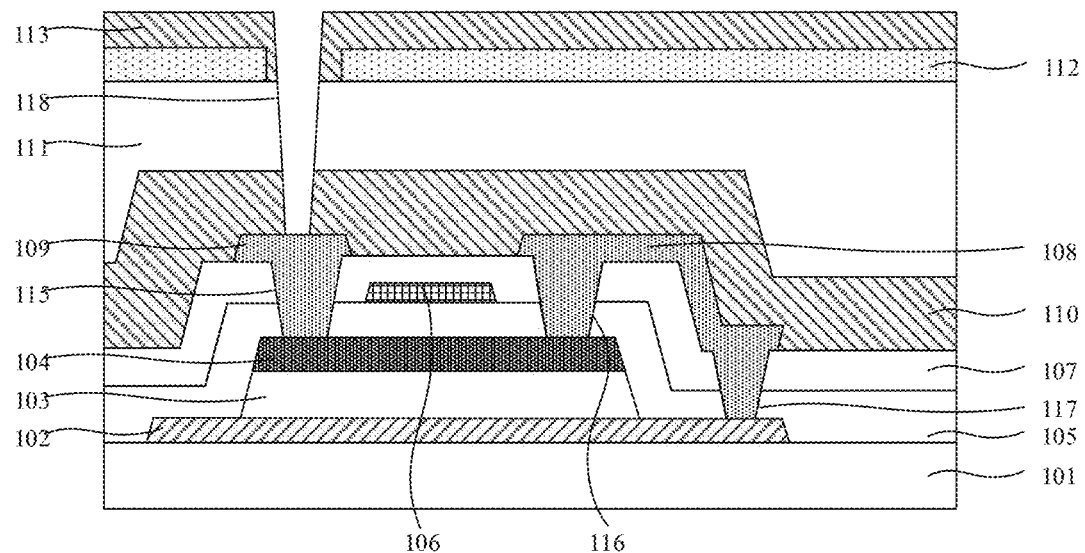
FIG. 29 is a schematic diagram illustrating a process of forming a fourth via, in accordance with some embodiments.

For example, as shown in FIGS. 28 and 29, the via 118a and the via 118b penetrating the planarization layer 111 and the first electrode layer 112 are used as preset vias, and the third passivation layer 113 located in the vias is etched using a patterning process to form the fourth via 118.

For example, as shown in FIG. 28, a diameter of the via 118b penetrating the first electrode layer 112 is greater than a diameter of the via 118a penetrating the planarization layer 111. That is, the diameter of the via 118b is greater than a diameter of the fourth via 118 to retain the third passivation layer 113 in the via 118b of the first electrode layer 112. As a result, an inner wall of the via 118b is covered by the third passivation layer 113, so as to prevent a portion of the second electrode layer 114 that is subsequently formed in the fourth via 118 from being coupled to the first electrode layer 112.

Figure 30:
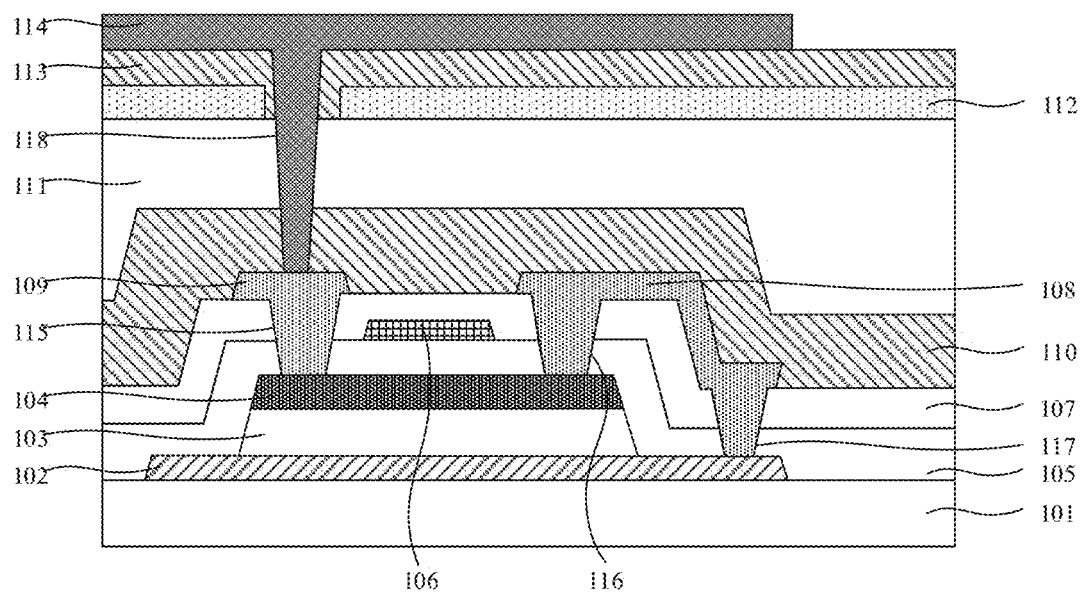
FIG. 30 is a schematic diagram illustrating a process of forming a second electrode layer, in accordance with some embodiments.

As shown in FIG. 30, by using a film deposition process, an electrode conductive layer is formed on a side of the third passivation layer 113 away from the base substrate 101. The electrode conductive layer is patterned to form the second electrode layer 114 using a wet etching process. The second electrode layer 114 is coupled to the source 108 or the drain 109 in the sub-pixel P through the fourth via 118.

The foregoing descriptions are merely some specific implementation manners of the present disclosure, but the protection scope of the present disclosure is not limited thereto, and changes or replacements that any person skilled in the art could conceive of within the technical scope disclosed by the present disclosure should be within the protection scope of the present disclosure. Therefore, the protection scope of the present disclosure shall be subject to the protection scope of the claims.

What is claimed is:

1. An array substrate, comprising:
    a base substrate;
    a light-shielding pattern, a buffer pattern and an active layer that are sequentially arranged on the base substrate, wherein an entire orthographic projection of the active layer on the base substrate coincides with an orthographic projection of at least part of the buffer pattern on the base substrate, the orthographic projection of the buffer pattern on the base substrate is within a border of an orthographic projection of the light-shielding pattern on the base substrate, and an area of the orthographic projection of the buffer pattern on the base substrate is less than an area of the orthographic projection of the light-shielding pattern on the base substrate;
    a gate insulating layer and a first passivation layer that are sequentially arranged on a side of the active layer away from the base substrate, wherein the gate insulating layer and the first passivation layer are provided with a first via, a second via and a third via, the first via penetrates the gate insulating layer and the first passivation layer, the second via and the third via penetrate only the gate insulating layer and the first passivation layer, the first via and the second via are used for exposing portions of the active layer, respectively, and the third via is used for exposing a portion of the light-shielding pattern, a depth of the second via is substantially equal to a depth of the third via; and
    a source and a drain disposed on a side of the first passivation layer away from the base substrate, wherein one of the source and the drain is coupled to the active layer through the first via; and another of the source and the drain is coupled to the active layer through the second via, and is coupled to the light-shielding pattern through the third via.

2. The array substrate according to claim 1, wherein a border of the orthographic projection of the buffer pattern on the base substrate substantially coincides with a border of the orthographic projection of the active layer on the base substrate.

3. The array substrate according to claim 1, wherein a border of the orthographic projection of the buffer pattern on the base substrate and the border of the orthographic projection of the light-shielding pattern on the base substrate have a distance therebetween.

4. The array substrate according to claim 3, wherein the orthographic projection of the buffer pattern on the base substrate and the orthographic projection of the light-shielding pattern on the base substrate are both in a shape of a rectangle, and a minimum distance between each edge of the border of the orthographic projection of the buffer pattern on the base substrate and a respective edge of the border of the orthographic projection of the light-shielding pattern on the base substrate is substantially equal.

5. The array substrate according to claim 3, wherein a ratio of the area of the orthographic projection of the buffer pattern on the base substrate to the area of the orthographic projection of the light-shielding pattern on the base substrate is in a range from 25% to 40%.

6. The array substrate according to claim 1, further comprising a second passivation layer, a planarization layer, a first electrode layer, a third passivation layer and a second electrode layer that are sequentially arranged on a side of the first passivation layer away from the base substrate, wherein
the second passivation layer, the planarization layer, the first electrode layer, and the third passivation layer are provided with a fourth via, and the fourth via is used for exposing at least a part of the source or at least a part of the drain, and the second electrode layer is coupled to the source or the drain through the fourth via.

7. The array substrate according to claim 6, wherein the second passivation layer and the third passivation layer are made of a same material.

8. The array substrate according to claim 1, wherein the first passivation layer and the gate insulating layer are made of a same material.

9. A display panel, comprising the array substrate according to claim 1.

10. A display device, comprising the display panel according to claim 9.

11. A method for manufacturing an array substrate, comprising:
forming a light-shielding pattern, a buffer pattern and an active layer on a base substrate, an entire orthographic projection of the active layer on the base substrate coinciding with an orthographic projection of at least part of the buffer pattern on the base substrate, the orthographic projection of the buffer pattern on the base substrate being within a border of an orthographic projection of the light-shielding pattern on the base substrate, and an area of the orthographic projection of the buffer pattern on the base substrate being less than an area of the orthographic projection of the light-shielding pattern on the base substrate;
sequentially forming a gate insulating layer and a first passivation layer on a side of the active layer away from the base substrate;
forming a first via, a second via and a third via in the gate insulating layer and the first passivation layer using a first patterning process, wherein the first via penetrates the gate insulating layer and the first passivation layer, the second via and the third via penetrate only the gate insulating layer and the first passivation layer, the first via and the second via are used for exposing portions of the active layer, respectively, and the third via is used for exposing a portion of the light-shielding pattern, a depth of the second via is substantially equal to a depth of the third via; and
forming a source and a drain on a side of the first passivation layer away from the base substrate, one of the source and the drain being coupled to the active layer through the first via, and another of the source and the drain being coupled to the active layer through the second via and coupled to the light-shielding pattern through the third via.

12. The method according to claim 11, wherein forming the light-shielding pattern, the buffer pattern and the active layer on the base substrate includes:
sequentially forming a light-shielding film, a buffer film and an active film on the base substrate;
patterning the active film, the buffer film and the light-shielding film using a second patterning process to form an initial active layer, an initial buffer pattern, and an initial light-shielding pattern;
removing a peripheral portion of the initial active layer to form the active layer;
removing a peripheral portion of the initial buffer pattern to form the buffer pattern; and
using the initial light-shielding pattern as the light-shielding pattern; or
removing a peripheral portion of the initial light-shielding pattern to form the light-shielding pattern.

13. The method according to claim 12, wherein patterning the active film, the buffer film and the light-shielding film using a second patterning process includes:
forming a photoresist film on a side of the active film away from the base substrate, wherein after the initial active layer is formed, a photoresist layer covers a surface of the initial active layer away from the base substrate and exposes a side face of the initial active layer; and
removing the peripheral portion of the initial active layer to form the active layer includes:
with the photoresist layer as a protective layer, using a wet etching process to perform etching from a side face of the initial active layer to remove the peripheral portion of the initial active layer to form the active layer, wherein an etching solution used in the wet etching process is incapable of dissolving the initial buffer pattern and the initial light-shielding pattern.

14. The method according to claim 13, wherein removing the peripheral portion of the initial buffer pattern to form the buffer pattern includes:
with the photoresist layer as a protective layer, using a dry etching process to remove a peripheral portion of the initial buffer pattern exposed by the photoresist layer to form the buffer pattern, wherein
etching gas used in the dry etching process is incapable of etching the active layer and the initial light-shielding pattern.

15. The method according to claim 11, wherein forming the light-shielding pattern, the buffer pattern and the active layer on the base substrate includes:
forming a light-shielding film on the base substrate;
patterning the light-shielding film to form the light-shielding pattern;

sequentially forming a buffer film and an active film on a side of the light-shielding pattern away from the base substrate;

patterning the active film and the buffer film using a third patterning process to form an initial active layer and an initial buffer pattern;

removing a peripheral portion of the initial active layer to form the active layer; and removing a peripheral portion of the initial buffer pattern to form the buffer pattern.

16. The method according to claim 15, wherein patterning the active film and the buffer film using a third patterning process includes:

forming a photoresist film on a side of the active film away from the base substrate, wherein after the initial active layer is formed, a photoresist layer covers a surface of the initial active layer away from the base substrate and exposes a side face of the initial active layer; and removing the peripheral portion of the initial active layer to form the active layer includes:

with the photoresist layer as a protective layer, using a wet etching process to perform etching from a side face of the initial active layer to remove the peripheral portion of the initial active layer to form the active layer, wherein an etching solution used in the wet etching process is incapable of dissolving the initial buffer pattern.

17. The method according to claim 16, wherein removing the peripheral portion of the initial buffer pattern to form the buffer pattern includes:

with the photoresist layer as a protective layer, using a dry etching process to remove a peripheral portion of the initial buffer pattern exposed by the photoresist layer to form the buffer pattern, wherein etching gas used in the dry etching process is incapable of etching the active layer.

* * * * *